United States Patent
Nagasaka et al.

(10) Patent No.: US 8,189,168 B2
(45) Date of Patent: May 29, 2012

(54) EXPOSURE APPARATUS, DEVICE PRODUCTION METHOD, CLEANING APPARATUS, CLEANING METHOD, AND EXPOSURE METHOD

(75) Inventors: Hiroyuki Nagasaka, Kumagaya (JP); Yasushi Yoda, Kumagayashi (JP)

(73) Assignee: Nikon Corporation, Tokyo (JP)

( * ) Notice: Subject to any disclaimer, the term of this patent is extended or adjusted under 35 U.S.C. 154(b) by 688 days.

(21) Appl. No.: 12/153,984

(22) Filed: May 28, 2008

(65) Prior Publication Data
US 2009/0251672 A1    Oct. 8, 2009

Related U.S. Application Data

(60) Provisional application No. 60/929,907, filed on Jul. 17, 2007.

(30) Foreign Application Priority Data

May 28, 2007 (JP) .................................. 2007-140474
Jul. 5, 2007 (JP) .................................. 2007-177217

(51) Int. Cl.
  G03B 27/52    (2006.01)
  G03B 27/42    (2006.01)
  G03B 27/58    (2006.01)
  G03B 27/68    (2006.01)
  G03B 27/32    (2006.01)

(52) U.S. Cl. ................ 355/30; 355/52; 355/53; 355/55; 355/72; 355/77

(58) Field of Classification Search .................... 355/30, 355/52, 53, 55, 72, 73, 77; 430/8, 30, 311, 430/312; 134/1

See application file for complete search history.

(56) References Cited

U.S. PATENT DOCUMENTS

| 4,465,368 | A | 8/1984 | Matsuura et al. |
| 5,610,683 | A | 3/1997 | Takahashi |
| 5,825,043 | A | 10/1998 | Suwa |
| 6,208,407 | B1 | 3/2001 | Loopstra |
| 6,226,073 | B1 * | 5/2001 | Emoto ............................ 355/53 |
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,496,257 | B1 * | 12/2002 | Taniguchi et al. ......... 356/239.2 |

(Continued)

FOREIGN PATENT DOCUMENTS

EP    1 079 223 A1    2/2001

(Continued)

OTHER PUBLICATIONS

English translation of JP 2006-165502, published on Jun. 22, 2006.*

(Continued)

*Primary Examiner* — Peter B Kim
*Assistant Examiner* — Christina Riddle
(74) *Attorney, Agent, or Firm* — Oliff & Berridge, PLC

(57) ABSTRACT

An exposure apparatus exposes a substrate with an exposure light through an exposure liquid. The exposure apparatus includes an optical element from which the exposure light exits; a stage which is movable on the light-exit side of the optical element; a certain member which is provided on the stage; and a vibration generator which vibrates the certain member to apply vibration to the liquid in the liquid immersion space formed on the certain member. It is possible to suppress the deterioration of the performance which would be otherwise caused by any contamination.

69 Claims, 15 Drawing Sheets

U.S. PATENT DOCUMENTS

| | | |
|---|---|---|
| 6,549,269 B1 | 4/2003 | Nishi et al. |
| 6,590,634 B1 | 7/2003 | Nishi et al. |
| 6,611,316 B2 | 8/2003 | Sewell |
| 6,778,257 B2 | 8/2004 | Bleeker et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,061,575 B2 | 6/2006 | Taniguchi et al. |
| 2002/0041377 A1 | 4/2002 | Hagiwara et al. |
| 2002/0061469 A1 | 5/2002 | Tanaka |
| 2003/0011763 A1 | 1/2003 | Taniguchi et al. |
| 2004/0165159 A1 | 8/2004 | Lof et al. |
| 2004/0168632 A1* | 9/2004 | Ito et al. ............. 118/715 |
| 2005/0024609 A1 | 2/2005 | De Smit et al. |
| 2005/0036121 A1* | 2/2005 | Hoogendam et al. ........... 355/30 |
| 2005/0094115 A1 | 5/2005 | Taniguchi et al. |
| 2005/0213065 A1 | 9/2005 | Kitaoka |
| 2005/0219488 A1* | 10/2005 | Nei et al. ................ 355/53 |
| 2005/0225734 A1* | 10/2005 | De Smit et al. ............... 355/30 |
| 2005/0248856 A1 | 11/2005 | Omura et al. |
| 2005/0280791 A1 | 12/2005 | Nagasaka et al. |
| 2006/0023185 A1* | 2/2006 | Hazelton et al. .............. 355/53 |
| 2006/0023186 A1 | 2/2006 | Binnard |
| 2006/0028626 A1 | 2/2006 | Chang et al. |
| 2006/0077367 A1* | 4/2006 | Kobayashi et al. ............. 355/53 |
| 2006/0103832 A1 | 5/2006 | Hazelton et al. |
| 2006/0132731 A1* | 6/2006 | Jansen et al. .................... 355/30 |
| 2006/0231206 A1 | 10/2006 | Nagasaka et al. |
| 2006/0250588 A1 | 11/2006 | Brandl |
| 2007/0091287 A1 | 4/2007 | Chang et al. |
| 2007/0127006 A1 | 6/2007 | Shibazaki |
| 2008/0018867 A1 | 1/2008 | Fujiwara et al. |
| 2009/0109413 A1* | 4/2009 | Shibazaki et al. ............. 355/30 |

FOREIGN PATENT DOCUMENTS

| | | |
|---|---|---|
| EP | 1 420 298 A2 | 5/2004 |
| EP | 1 429 188 A2 | 6/2004 |
| EP | 1 667 211 A1 | 6/2006 |
| EP | 1 699 072 A1 | 9/2006 |
| EP | 1 713 113 A1 | 10/2006 |
| EP | 1 713 115 A1 | 10/2006 |
| EP | 1 783 822 A1 | 5/2007 |
| JP | A-06-124873 | 5/1994 |
| JP | A-10-303114 | 11/1998 |
| JP | A-11-162831 | 6/1999 |
| JP | A-11-176727 | 7/1999 |
| JP | A-2004-289126 | 10/2004 |
| JP | A-2004-289127 | 10/2004 |
| JP | A-2006-032750 | 2/2006 |
| JP | 2006165502 A * | 6/2006 |
| JP | A-2006-147639 | 6/2006 |
| JP | A-2007-123882 | 5/2007 |
| WO | WO 99/49504 A1 | 9/1999 |
| WO | WO 01/35168 A1 | 5/2001 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/093130 A2 | 10/2004 |
| WO | WO 2005/029559 A1 | 3/2005 |
| WO | WO 2005/031820 | 4/2005 |
| WO | WO 2005/055296 A1 | 6/2005 |
| WO | WO 2005/059617 A2 | 6/2005 |
| WO | WO 2005/059618 A2 | 6/2005 |
| WO | WO 2005/076324 A1 | 8/2005 |
| WO | WO 2005/124833 A1 | 12/2005 |
| WO | WO 2006/038952 A2 | 4/2006 |
| WO | WO 2006/062065 A1 | 6/2006 |

OTHER PUBLICATIONS

Sep. 2, 2008 International Search Report issued in International Application No. PCT/JP2008/059744 (with translation).

Sep. 2, 2008 Written Opinion of the International Search Authority issued in International Application No. PCT/JP2008/059744 (with translation).

* cited by examiner

Fig. 7
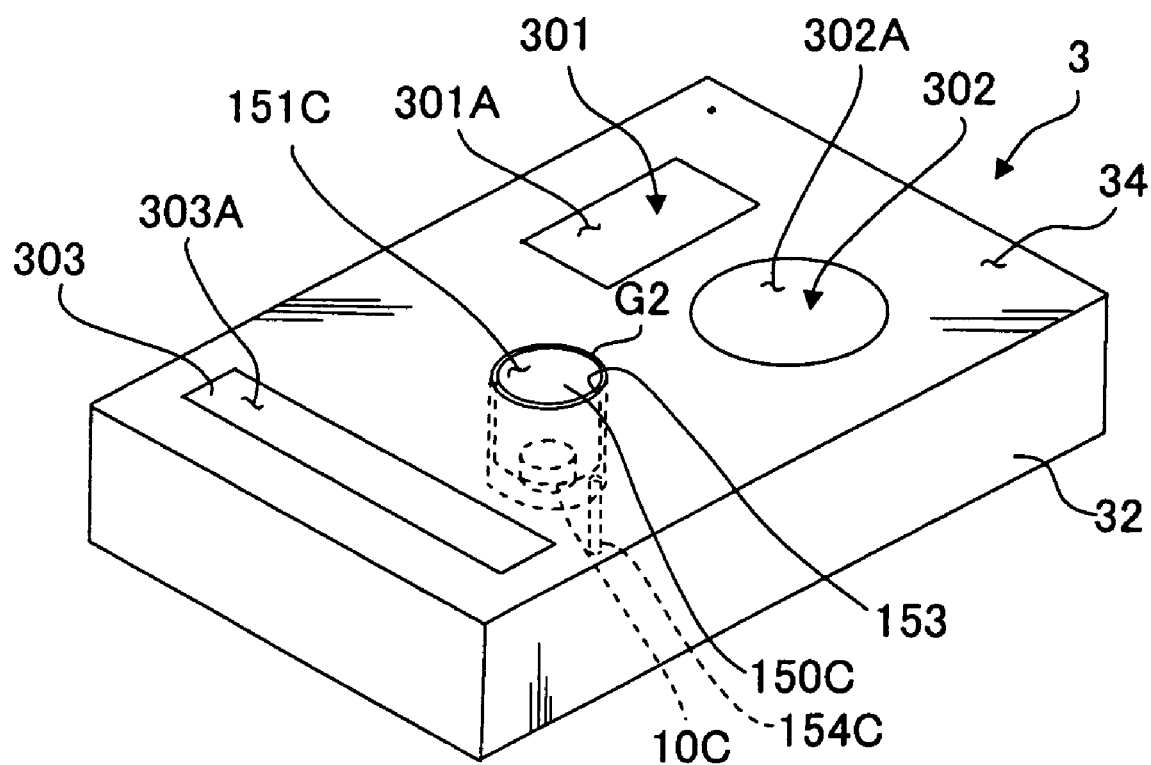
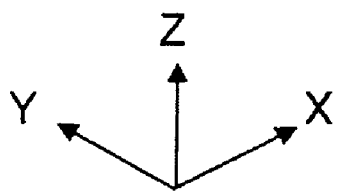

EXPOSURE APPARATUS, DEVICE PRODUCTION METHOD, CLEANING APPARATUS, CLEANING METHOD, AND EXPOSURE METHOD

BACKGROUND OF THE INVENTION

1. Field of the Invention

The present invention relates to an exposure apparatus which exposes a substrate, a device production method, a cleaning apparatus, a method for cleaning the exposure apparatus, and an exposure method.

2. Description of the Related Art

In relation to the exposure apparatus used in the photolithography step, a liquid immersion exposure apparatus is known, in which a substrate is exposed with an exposure light through a liquid as disclosed in International Publication No. 99/49504 and Japanese Patent Application Laid-open No. 2004-289127.

SUMMARY OF THE INVENTION

Task to be Solved by the Invention

In an liquid immersion exposure apparatus, there is such a possibility that a member, which makes contact with a liquid of the liquid immersion space, may be contaminated or dirtied. If the member is left to stand as it is in the contaminated or dirtied state, there is such a possibility that the performance of the exposure apparatus may be deteriorated, and the substrate cannot be exposed satisfactorily.

An object of the present invention is to provide an exposure apparatus which makes it possible to suppress the deterioration of the performance due to the contamination, and a device production method using the exposure apparatus. Another object of the present invention is to provide a cleaning apparatus which is capable of satisfactorily cleaning a liquid immersion exposure apparatus, a cleaning method using the cleaning apparatus, and an exposure method.

Solution to the Task

According to a first aspect of the present invention, there is provided an exposure apparatus which exposes a substrate with an exposure light through an exposure liquid, the exposure apparatus comprising: an optical element from which the exposure light exits; a movable member which is movable on a light-exit side of the optical element; a certain member which is provided on the movable member; and a vibration generator which vibrates the certain member to apply vibration to a cleaning liquid on the certain member; wherein at least a part of a surface of the certain member is liquid-repellent with respect to at least one of the exposure liquid and the cleaning liquid.

According to a second aspect of the present invention, there is provided an exposure apparatus which exposes a substrate with an exposure light through an exposure liquid, the exposure apparatus comprising: an optical element from which the exposure light exits; a movable member which is movable on a light-exit side of the optical element; a certain member which is provided on the movable member; a vibration generator which vibrates the certain member to apply vibration to a cleaning liquid on the certain member; and a suppressing device which suppresses diffusion of heat generated by the vibration generator.

According to a third aspect of the present invention, there is provided a method for producing a device, the method comprising: exposing a substrate by using the exposure apparatus as defined in any one of the foregoing aspects; and developing the exposed substrate.

According to a fourth aspect of the present invention, there is provided a cleaning apparatus usable for a liquid immersion exposure apparatus which exposes a substrate with an exposure light through an exposure liquid, the cleaning apparatus comprising a certain member; and a vibration generator which vibrates the certain member to apply vibration to a cleaning liquid making contact with the certain member; wherein at least a part of a surface of the certain member is liquid-repellent with respect to at least one of the exposure liquid and the cleaning liquid.

According to a fifth aspect of the present invention, there is provided a cleaning apparatus usable for a liquid immersion exposure apparatus which exposes a substrate with an exposure light through an exposure liquid, the cleaning apparatus comprising: a certain member; a vibration generator which vibrates the certain member to apply vibration to a cleaning liquid making contact with the certain member; and a suppressing device which suppresses diffusion of heat generated by the vibration generator.

According to a sixth aspect of the present invention, there is provided a cleaning method comprising forming a liquid immersion space, in a liquid immersion exposure apparatus which exposes a substrate with an exposure light through an exposure liquid, with a cleaning liquid on the certain member of the cleaning apparatus according to any one of the foregoing aspects; and applying ultrasonic vibration to the cleaning liquid in the liquid immersion space.

According to a seventh aspect of the present invention, there is provided a liquid immersion exposure method for exposing a substrate with an exposure light through an exposure liquid by using an exposure apparatus having first and second tables, the liquid immersion exposure method comprising: performing measurement for determining an exposure condition, via the exposure liquid placed between an optical element and a measuring device which is provided on the first table; exposing the substrate with the exposure light through the exposure liquid while retaining the exposure liquid between the substrate and the optical element; and placing a cleaning liquid between the optical element and a vibrator provided on the first or second table and vibrating the vibrator to clean a portion, of the exposure apparatus, which makes contact with the exposure liquid.

According to the respective aspects of the present invention, it is possible to suppress the deterioration of the performance of the exposure apparatus which would be otherwise caused due to any contamination.

BRIEF DESCRIPTION OF THE DRAWINGS

FIG. 7 is a perspective view of a measuring table according to a third embodiment.

PREFERRED EMBODIMENT FOR CARRYING OUT THE INVENTION

Embodiments will be explained below with reference to the drawings in relation to the exposure apparatus of the present invention and the cleaning apparatus usable therefor. However, the present invention is not limited to these. In the following description, an XYZ rectangular coordinates system is defined. The positional relationship concerning respective members of the exposure apparatus and the cleaning apparatus usable therefor will be explained with reference to the XYZ rectangular coordinates system. An X axis direction is a predetermined direction in a horizontal plane, a Y axis direction is a direction which is perpendicular to the X axis direction in the horizontal plane, and a Z axis direction is a direction which is perpendicular to each of the X axis direction and the Y axis direction (i.e., the vertical direction). Directions of rotation (inclination) about the X axis, the Y axis, and the Z axis are designated as the θX, θY, and θZ directions respectively.

First Embodiment

Figure 1:
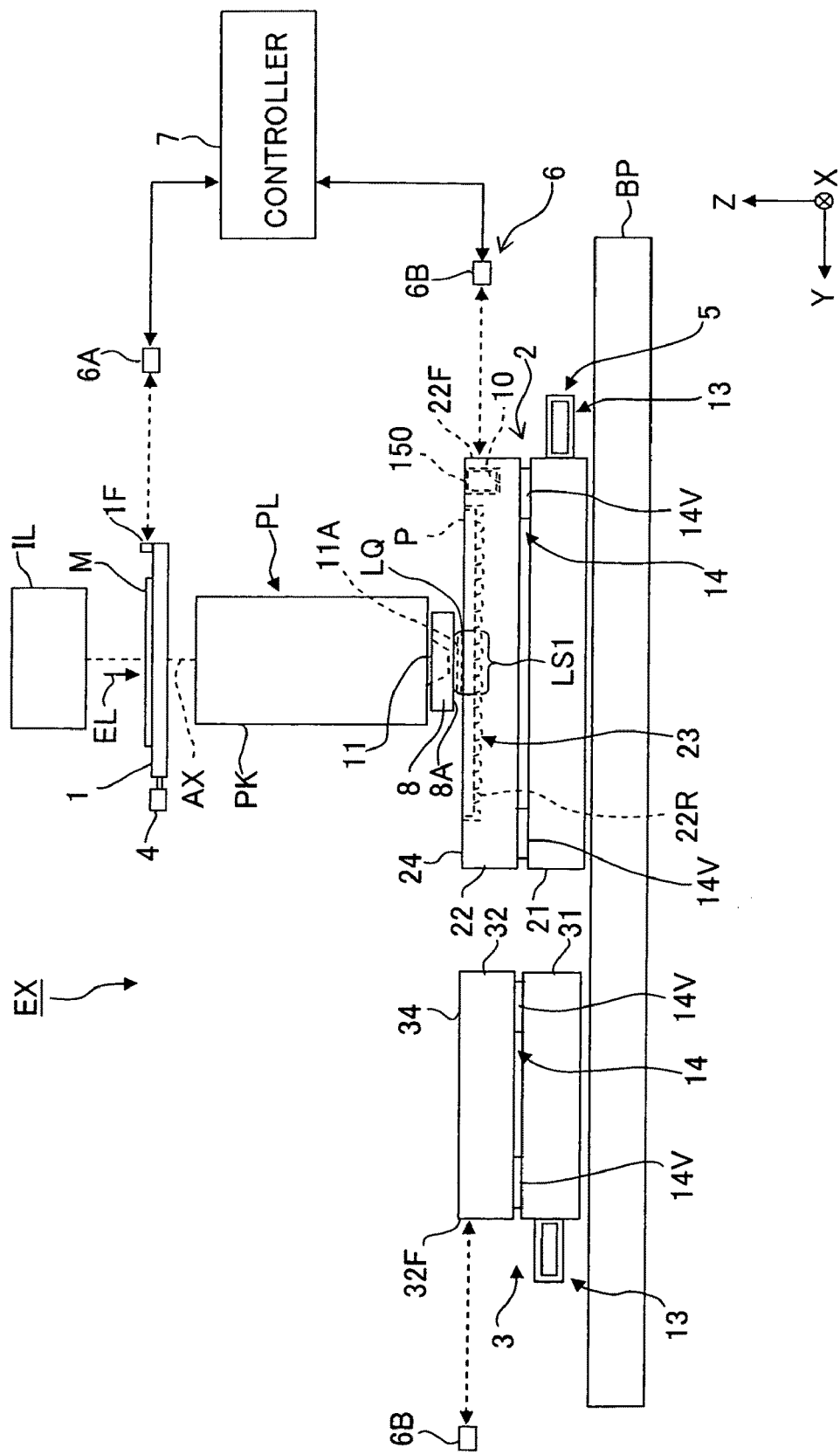
FIG. 1 is a schematic arrangement view of an exposure apparatus according to a first embodiment.

A first embodiment will be explained. FIG. 1 is a schematic arrangement view of an exposure apparatus EX according to the first embodiment. This embodiment will be explained as exemplified by a case wherein the exposure apparatus EX includes a substrate stage 2 which is movable while holding a substrate P, and a measuring stage 3 which is movable with a measuring device or measuring devices capable of executing a predetermined measurement in relation to the exposure provided thereon, and which does not hold the substrate P, as disclosed for example in U.S. Pat. No. 6,897,963, European Patent Application Publication No. 1,713,113, and the like.

With reference to FIG. 1, the exposure apparatus EX includes a mask stage 1 which is movable while holding a mask M; a substrate stage 2 which is movable while holding the substrate P; a measuring stage 3 which is provided with a measuring device capable of executing a predetermined measurement in relation to the exposure, which does not hold the substrate P, and which is movable independently from the substrate stage 2; a first driving system 4 which moves the mask stage 1; a second driving system 5 which moves the substrate stage 2 and the measuring stage 3; an interferometer system 6 including laser interferometers 6A, 6B which measure the position information about each of the mask and substrate stages; an illumination system IL which illuminates the mask M with an exposure light EL; a projection optical system PL which projects, onto the substrate P, an image of a pattern of the mask M illuminated with the exposure light EL; and a controller 7 which controls the entire operation of the exposure apparatus EX.

The substrate P referred to herein is a substrate for exposure to produce a device, and includes, for example, those in which a film of a photosensitive material (photoresist), etc. is formed on a base material including a semiconductor wafer such as a silicon wafer and the like. The substrate P also includes those which are coated with various films of, for example, a protective film (top coat film) in addition to the photosensitive material. The mask M includes a reticle on which a device pattern, to be projected onto the substrate P, is formed. In this embodiment, a transmission type mask is used as the mask M. However, it is also possible to use a reflection type mask. The transmission type mask is not limited to a binary mask on which the pattern is formed with the light-shielding film, and also includes, for example, a phase shift mask of the spatial frequency modulation type or the half tone type.

The exposure apparatus EX of the embodiment of the present invention is a liquid immersion exposure apparatus in which the substrate P is exposed with the exposure light EL through an exposure liquid LQ. A first liquid immersion space LS1 is formed with the exposure liquid LQ so that at least a part of the optical path space for the exposure light EL is filled with the exposure liquid LQ. In this embodiment, the first liquid immersion space LS1 is formed so that the optical path space for the exposure light EL, between a last or final optical element 11 and an object arranged opposite to or facing the final optical element 11, is filled with the exposure liquid LQ. The final optical element 11 is arranged closest to the image plane of the projection optical system PL, among a plurality of optical elements of the projection optical system PL. In this specification, as for the "liquid immersion space", a space or an area, which is actually filled with the liquid, is referred to as "liquid immersion space". The final optical element 11 has a lower surface (light exit surface) 11A from which (via which) the exposure light EL exits or is irradiated toward the image plane of the projection optical system PL. The first liquid immersion space LS1 is formed so that the optical path space, for the exposure light EL, which is between the lower surface 11A of the final optical element 11 and the object opposite to the light exit surface 11A of the final optical element 11, is filled with the exposure liquid LQ. The exposure apparatus EX radiates the exposure light EL onto the substrate P through the exposure liquid LQ to expose the substrate P.

The exposure apparatus EX of this embodiment is provided with a nozzle member 8 which is capable of forming the first liquid immersion space LS1. The nozzle member 8 is arranged in the vicinity of the final optical element 11. The nozzle member 8 has a lower surface 8A which is capable of being opposite to or facing (opposable to) the object arranged at the position opposite to the lower surface 11A of the final optical element 11. In this embodiment, the first liquid immersion space LS1 is formed by the exposure liquid LQ which is held or retained between the final optical element 11 and the nozzle member 8 and the object opposite to the final optical element 11 and the nozzle member 8.

The object, which is opposable to the final optical element 11 and the nozzle member 8, includes an object which is movable on the light-exit side of the final optical element 11 (on the side of the image plane (image plane side) of the projection optical system PL). In this embodiment, the object, which is movable on the light-exit side of the final optical element 11, includes at least one of the substrate stage 2, the substrate P held by the substrate stage 2, and the measuring stage 3.

In this embodiment, a second liquid immersion space LS2 is formed with a cleaning liquid LC, at a predetermined timing, between the final optical element 11 and the nozzle member 8 and the object opposite to the final optical element 11 and the nozzle member 8. By forming the second liquid immersion space LS2 with the cleaning liquid LC, it is possible to clean or wash a surface of the member which makes contact with the cleaning liquid LC of the second liquid immersion space LS2.

In this embodiment, the liquid immersion space is formed so that a partial area (local area) of the surface of the object described above is covered with the liquid. The interface of the liquid (meniscus, edge) is formed between the surface of the object and the lower surface 8A of the nozzle member 8. When the substrate P is exposed, the first liquid immersion space LS1 is formed so that a partial area on the substrate P, which includes the projection area of the projection optical system PL, is covered with the first liquid LQ. That is, the liquid immersion exposure apparatus EX of this embodiment adopts the local liquid immersion system.

The optical path space for the exposure light EL described above is a space which includes the optical path via which the exposure light EL passes. The liquid immersion space is a space filled with the liquid. In the following description, the exposure liquid LQ is appropriately referred to as "first liquid LQ", and the cleaning liquid LC is appropriately referred to as "second liquid LC".

The exposure apparatus EX of this embodiment is provided with a vibration member 150 which is provided on the substrate stage 2 (substrate table 22), and a vibration generator 10 which vibrates the vibration member 150. The vibration generator 10 vibrates the vibration member 150 to thereby apply the vibration to the liquid in the liquid immersion space formed on the vibration member 150.

The illumination system IL illuminates a predetermined illumination area on the mask M with the exposure light EL having a uniform illuminance distribution. Those usable as the exposure light EL radiated from the illumination system IL include, for example, the far ultraviolet light beams (DUV light beams) such as the emission lines (g-ray, h-ray, and i-ray) radiated, for example, from a mercury lamp and the KrF excimer laser beam (wavelength: 248 nm), and the vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light EL.

The mask stage 1 is movable in the three directions of the X axis, Y axis, and θZ directions by the first driving system 4 in a state that the mask M is held on the mask stage 1. The first driving system 4 includes an actuator such as a linear motor or the like. The position information about the mask stage 1 (mask M) is measured by the laser interferometer 6A of the interferometer system 6. The laser interferometer 6A measures the position information of the mask stage 1 in relation to the X axis, Y axis, and θZ directions by using a measuring mirror 1F provided on the mask stage 1. The controller 7 controls the position of the mask stage 1 (mask M) by using the first driving system 4 based on a measurement result obtained by the interferometer system 6.

The projection optical system PL projects the image of the pattern of the mask M onto the substrate P at a predetermined projection magnification. The optical elements of the projection optical system PL are held by a barrel PK. The projection optical system PL of this embodiment is based on the reduction system having the projection magnification which is, for example, ¼, ⅕, ⅛ or the like. The projection optical system PL may be of any one of the 1× magnification system and the magnifying system. In this embodiment, the optical axis AX of the projection optical system PL is parallel to the Z axis direction. The projection optical system PL may be of any one of the dioptric system including no catoptric optical element, the catoptric system including no dioptric optical element, and the catadioptric system including catoptric and dioptric optical elements. The projection optical system PL may form any one of an inverted image and an erecting image. Although not shown, the projection optical system PL is provided on a barrel surface plate supported by three support columns by the aid of an anti-vibration mechanism. However, as disclosed, for example, in International Publication No. 2006/038952, the projection optical system may be supported by being hung from an unillustrated main frame member which is arranged over or above the projection optical system PL, a base member on which the mask stage 1 is arranged, or the like.

The substrate stage 2 has a body 21 of the substrate stage 2 (stage body 21), and a substrate table 22 which is provided on the stage body 21. The substrate table 22 has a holding portion 23 which detachably holds the substrate P. The holding portion 23 holds the substrate P so that the surface of the substrate P is substantially parallel to the XY plane. The substrate table 22 has a first recess 22R. The holding portion 23 is arranged in the first recess 22R. An upper surface 24 of the substrate table 22 is arranged around the first recess 22R. The upper surface 24 of the substrate table 22 is arranged around the surface of the substrate P held by the holding portion 23. An upper surface 24 is substantially flat, and is arranged in a plane approximately same as the surface of the substrate P held by the holding portion 23 (in the XY plane). That is, the upper surface 24 of the substrate table 22 is substantially flush with the surface of the substrate P held by the holding portion 23. The surface of the substrate P held by the holding portion 23 and the upper surface 24 of the substrate table 22 are opposable to the lower surface 11A of the final optical element 11 and the lower surface 8A of the nozzle member 8.

The measuring stage 3 has a body 31 of the measuring stage 3 (stage body 31), and a measuring table 32 which is provided on the stage body 31. At least a part of the measuring device is provided on the measuring table 32. The measuring device includes a reference member formed with a reference mark such as a mark for the alignment sensor, and various photoelectric sensors. The measuring device is, for example, an uneven illuminance sensor as disclosed, for example, in U.S. Pat. No. 4,465,368, a spatial image measuring device for measuring the light intensity of the spatial image (projected image) of the pattern projected by the projection optical system PL as disclosed, for example, in United States Patent Application Publication No. 2002/0041377, an illuminance monitor as disclosed, for example, in United States Patent Application Publication No. 2002/0061469, and a wave aberration measuring device as disclosed in European Patent No. 1,079,223. The upper surface 34 of the measuring table 32 is substantially flat, and is substantially parallel to the XY plane. The upper surface 34 of the measuring table 32 is opposable to the lower surface 11A of the final optical element 11 and the lower surface 8A of the nozzle member 8.

The second driving system 5 is capable of moving each of the substrate stage 2 and the measuring stage 3. The second driving system 5 is provided with a coarse movement system 13 which moves each of the stage bodies 21, 31 on the base member BP; and a fine movement system 14 which moves the tables 22, 32 on the stage bodies 21, 31, respectively.

The coarse movement system 13 includes an actuator such as a linear motor. The coarse movement system 13 is capable of moving each of the stage bodies 21, 31 on the base member BP in the X axis, Y axis, and θZ directions. When each of the stage bodies 21, 31 is moved in the X axis, Y axis, and θZ directions by the coarse movement system 13, the tables 22, 32, which are provided on the stage bodies 21, 31, respectively, are also moved in the X axis, Y axis, and θZ directions together with the stage bodies 21, 31 respectively.

The fine movement system 14 includes actuators 14V, such as voice coil motors or the like, which are intervened between the stage bodies 21, 31 and the tables 22, 32 respectively; and unillustrated measuring devices (for example, encoders) which measure the driving amounts of the actuators 14V respectively. The fine movement system 14 is capable of moving the tables 22, 23 on the respective stage bodies 21, 31, respectively, at least in the Z axis, θX axis, and θY directions. Further, the fine movement system 14 is capable of moving (finely moving) the tables 22, 32 on the stage bodies 21, 31 respectively, in the X axis, Y axis, and θZ directions.

The substrate table 22 is movable in the six directions of the X axis, Y axis, Z axis, θX, θY, and θZ directions, in a state that the substrate P is held to the substrate table 22 with the holding portion 23, by the second driving system 5 which includes the coarse movement system 13 and the fine movement system 14. Similarly, the measuring table 32 is movable by the second driving system 5 in the six directions of the X axis, Y axis, Z axis, θX, θY, and θZ directions in a state that the measuring devices are held to the measuring table 32.

The position information of the substrate table 22 (substrate P) and the position information of the measuring table 32 are measured by the laser interferometer 6B of the interferometer system 6. The laser interferometer 6B measures the position information of each of the tables 22, 32 in relation to the X axis, Y axis, and θZ directions by using the measuring mirrors 22F, 32F of the tables 22, 32, respectively. The surface position information of the surface of the substrate P held by the holding portion 23 of the substrate table 22 (position information in relation to the Z axis, and θX, and θY directions) and the surface position information of the predetermined area of the upper surface of the measuring table 32 are detected by a focus/leveling-detecting system (not shown). The controller 7 controls the position of the substrate table 22 (substrate P) and the position of the measuring table 32 by using the second driving system 5 based on a measurement result obtained by the laser interferometer 6B of the interferometer system 6 and based on a detection result obtained by the focus/leveling-detecting system, respectively.

Figure 2:
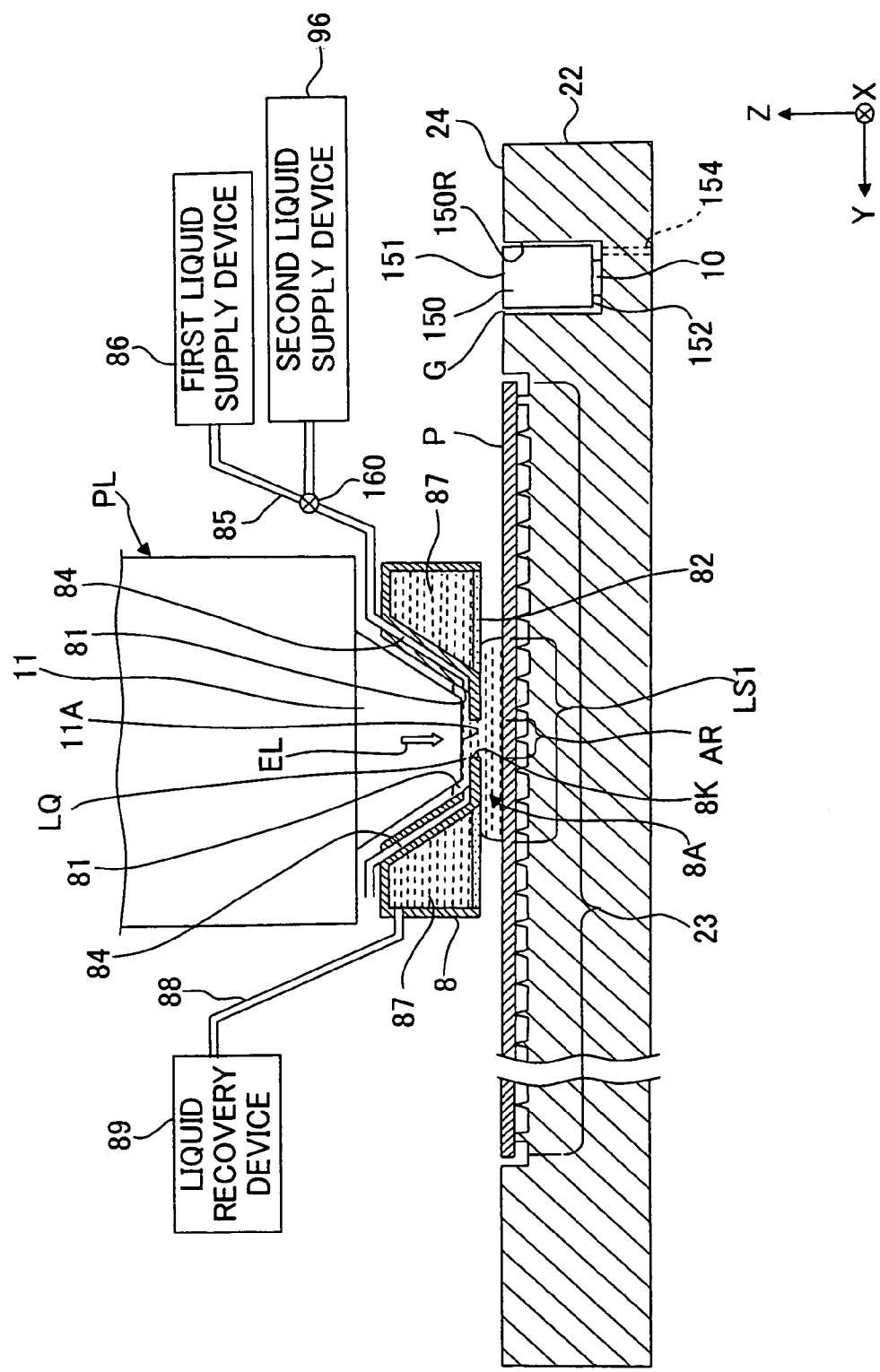
FIG. 2 is a side sectional view of those disposed in the vicinity of a substrate table and a nozzle member according to the first embodiment.
Figure 3:
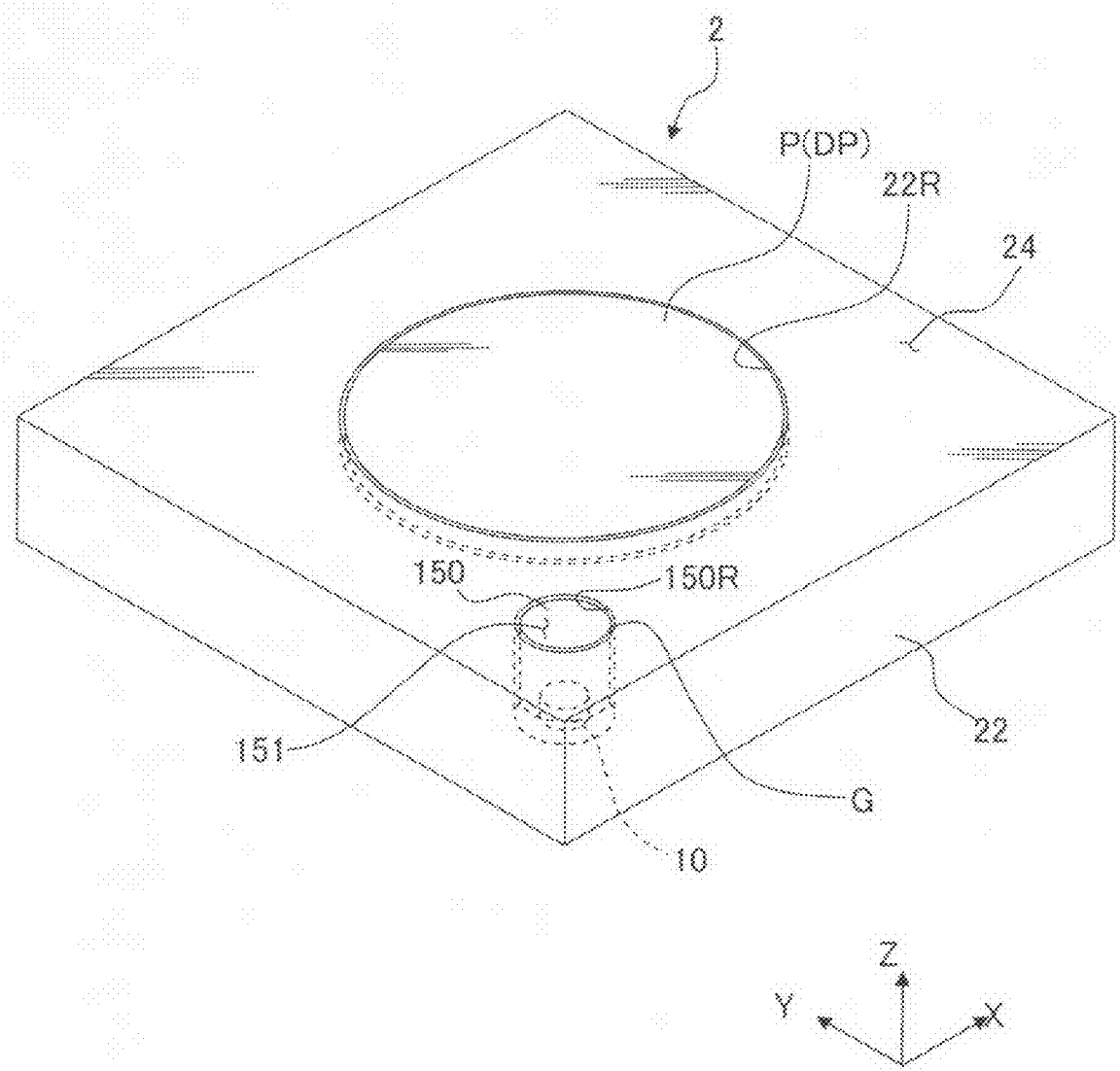
FIG. 3 is a perspective view of the substrate table according to the first embodiment.

FIG. 2 is a side sectional view of those disposed in the vicinity of the substrate table 22 and the nozzle member 8. FIG. 3 is a perspective view of the substrate table 22 according to this embodiment. As shown in FIGS. 1, 2, and 3, the vibration member 150 is provided on the substrate table 22 in this embodiment. The substrate table 22 is movable on the light-exit side of the final optical element 11. The vibration member 150, which is provided on the substrate table 22, is also movable on the light-exit side of the final optical element 11. The vibration member 150 is a rod-shaped member. In this embodiment, the vibration member 150 is formed of silica glass. The substrate table 22 has a second recess 150R which is distinct or different from the first recess 22R. The vibration member 150 is arranged in the second recess 150R. The upper surface 24 of the substrate table 22 is arranged around the upper end of the second recess 150R.

The vibration member 150 has an upper surface 151 which is opposable to the lower surface 11A of the final optical element 11 and the lower surface 8A of the nozzle member 8.

In this embodiment, the upper surface 151 of the vibration member 150 is flat. In this embodiment, the vibration member 150 is arranged in the second recess 150R so that the upper surface 151 is substantially parallel to the XY plane. However, the upper surface 151 of the vibration member 150 may be a curved surface. Alternatively, the upper surface 151 of the vibration member 150 may be inclined with respect to the XY plane.

The upper surface 24 of the substrate table 22 is arranged around the upper surface 151 of the vibration member 150 arranged in the second recess 150R. The upper surface 151 of the vibration member 150 and the upper surface 24 of the substrate table 22 are arranged with a predetermined gap G intervening therebetween. That is, the gap is formed between the vibration member 151 and the member forming the upper surface 24 of the substrate table 22. In this embodiment, the gap G is, for example, about 0.1 mm.

In this embodiment, the upper surface 151 of the vibration member 150 and the upper surface 24 of the substrate table 22 are arranged in a same plane (XY plane). In other words, the upper surface 151 of the vibration member 150 and the upper surface 24 of the substrate table 22 are substantially flush with each other. Further, the upper surface 151 of the vibration member 150 and the upper surface 24 of the substrate table 22 are substantially flush with the surface of the substrate P held by the holding portion 23 of the substrate table 22.

The vibration generator 10 is connected to the vibration member 150. In this embodiment, the vibration generator 10 is connected to the lower surface 152 of the vibration member 150. The vibration generator 10 is arranged at the inside of the second recess 150R. The vibration generator 10 is connected to the lower surface 152 of the vibration member 150 at the inside of the second recess 150R.

The vibration generator 10 vibrates the vibration member 150. The vibration generator 10 includes an ultrasonic wave generator, and applies the ultrasonic wave to the vibration member 150. In this embodiment, the vibration generator 10 includes a piezoelectric element such as PZT (lead zirconate titanate) or a quartz oscillator, and a circuit for driving the piezoelectric element. A magnetorestrictive oscillator or generator, which is obtained by winding a coil around a ferrite core, may be used instead of the piezoelectric element. The vibration generator 10 is controlled by the controller 7. The controller 7 of the exposure apparatus EX vibrates the vibration member 150 by using the vibration generator 10. The driving circuit for the piezoelectric element may be incorporated into the controller 7. In the following description, the vibration generator 10 is appropriately referred to as "ultrasonic wave generator 10".

As shown in FIG. 2, the nozzle member 8 is arranged in the vicinity of the final optical element 11. The nozzle member 8 is an annular member which is arranged around the final optical element 11 (optical path space for the exposure light EL). For example, when the first liquid immersion space LS1 is formed on the substrate P, the first liquid LQ is retained between the surface of the substrate P and the lower surface 11A of the final optical element 11 and the lower surface 8A of the nozzle member 8.

The nozzle member 8 has a supply port 81 which is capable of supplying the first liquid LQ, and a recovery port 82 which is capable of recovering the first liquid LQ. The recovery port 82 is arranged at a part of the lower surface 8A of the nozzle member 8. An opening 8K is formed at a part, of the nozzle member 8, opposite to or facing the lower surface 11A of the final optical element 11. The exposure light EL, irradiated from the lower surface 11A of the final optical element 11, passes through the opening 8K, and the exposure light EL is irradiated onto the substrate P.

The exposure apparatus EX is provided with a first liquid supply device 86 which provides or generates the first liquid LQ, a second liquid supply device 96 which provides or generates the second liquid LC, and a liquid recovery device 89 which is capable of recovering the liquid. The first liquid supply device 86, the second liquid supply device 96, and the liquid recovery device 89 are controlled by the controller 7. The first liquid supply device 86 and the supply port 81 are connected to each other via a supply tube 85 and a supply flow passage 84 which is formed in the nozzle member 8. The liquid recovery device 89 and the recovery port 82 are connected to each other via a recovery tube 88 and a recovery flow passage 87 which is formed in the nozzle member 8. The second liquid supply device 96 is connected to the supply tube 85 via a flow passage-switching mechanism 160. The flow passage-switching mechanism 160 is controlled by the controller 7.

As described above, the first liquid LQ is an exposure liquid or a liquid for the exposure. The first liquid LQ, which is clean and temperature-adjusted, can be fed to the supply port 81 by the first liquid supply device 86. The second liquid LC is a cleaning liquid or a liquid for cleaning. The second liquid LC can be fed to the supply port 81 by the second liquid supply device 96. The liquid recovery device 89 includes a vacuum system, and is capable of recovering the first liquid LQ and the second liquid LC.

In this embodiment, the controller 7 can stop the supply of the second liquid LC from the second liquid supply device 96 to the supply port 81 when the first liquid LQ fed from the first liquid supply device 86 is supplied to the supply port 81, by controlling the flow passage-switching mechanism 160, the first liquid supply device 86, and the second liquid supply device 96. Further, the controller 7 can stop the supply of the first liquid LQ from the first liquid supply device 86 to the supply port 81 when the second liquid LC fed from the second liquid supply device 96 is supplied to the supply port 81.

For example, in order to form the first liquid immersion space LS1 with the first liquid LQ, the controller 7 stops the supply of the second liquid LC from the second liquid supply device 96 to the supply port 81, and feeds the first liquid LQ from the first liquid supply device 86. The first liquid LQ fed from the first liquid supply device 86 flows through the supply tube 85 and the supply flow passage 84 of the nozzle member 8, and then the first liquid LQ is supplied to the supply port 81. The supply port 81 supplies the first liquid LQ fed from the first liquid supply device 86 in order to form the first liquid immersion space LS1 with the first liquid LQ. The first liquid LQ, which is recovered from the recovery port 82 in accordance with the operation of the liquid recovery device 89, flows through the recovery flow passage 87 of the nozzle member 8, and then the first liquid LQ is recovered by the liquid recovery device 89 via the recovery tube 88. The controller 7 executes the recovery operation to recover the first liquid LQ, using the recovery port 82, concurrently with the supply operation to supply the first liquid LQ using the supply port 81, thereby forming the first liquid immersion space LS1.

On the other hand, in order to form the second liquid immersion space LS2 with the second liquid LC, the controller 7 stops the supply of the first liquid LQ from the first liquid supply device 86 to the supply port 81, and feeds the second liquid LC from the second liquid supply device 96. The second liquid LC, fed from the second liquid supply device 96, flows through the supply tube 85 and the supply flow passage 84 of the nozzle member 8, and then the second liquid LC is supplied to the supply port 81. The supply port 81 supplies the second liquid LC fed from the second liquid supply device 96 in order to form the second liquid immersion space LS2 with the second liquid LC. The second liquid LC, recovered from the recovery port 82 in accordance with the operation of the liquid recovery device 89, flows through the recovery flow passage 87 of the nozzle member 8, and then the second liquid LC is recovered by the liquid recovery device 89 via the recovery tube 88. The controller 7 executes the recovery operation to recover the second liquid LC, using the recovery port 82, concurrently with the supply operation to supply the second liquid LC using the supply port 81, thereby forming the second liquid immersion space LS2.

In this way, the supply port 81 is capable of supplying each of the first liquid LQ and the second liquid LC in this embodiment.

In this embodiment, water (pure or purified water) is used as the first liquid LQ.

In this embodiment, any liquid, which is different from the first liquid LQ, is used as the second liquid LC. In this embodiment, hydrogen water (hydrogen-dissolved water), in which hydrogen gas is dissolved in water, is used as the second liquid LC.

Those usable as the second liquid LC also include dissolved gas conditioned water in which predetermined gas is dissolved in water, including, for example, ozone water (ozone-dissolved water) in which ozone gas is dissolved in water, nitrogen water (nitrogen-dissolved water) in which nitrogen gas is dissolved in water, argon water (argon-dissolved water) in which argon gas is dissolved in water, carbon dioxide water (carbon dioxide-dissolved water) in which carbon dioxide gas is dissolved in water, and the like. The second liquid LC may also be any gas supersaturation water in which gas is dissolved while exceeding the solubility to be obtained at the atmospheric pressure. It is also allowable to use, as the second liquid LC, any chemical-added water in which a predetermined chemical is added to water, including, for example, hydrogen peroxide water in which hydrogen peroxide is added to water, chlorine-added water in which hydrochloric acid (hypochlorous acid) is added to water, ammonia water in which ammonia is added to water, choline water in which choline is dissolved, sulfuric acid-added water in which sulfuric acid is added to water, etc. It is also allowable to use, as the second liquid LC, alcohols such as ethanol and methanol, ethers, gamma-butylolactone, thinners, surfactants, fluorine-based solvents such as HFE, etc.

In this embodiment, the upper surface 151 of the vibration member 150 is liquid-repellent or lyophobic with respect to the first liquid LQ and the second liquid LC. The contact angle of the upper surface 151 of the vibration member 150 with respect to each of the first liquid LQ and the second liquid LC is not less than 90 degrees. In this embodiment, the upper surface 151 of the vibration member 150 is formed of a film of a liquid-repellent material including, for example, fluorine-based resin (for example, PTFE, PFA or the like). It is desirable that the side surface of the vibration member 150 is also liquid-repellent with respect to the first liquid LQ and the second liquid LC.

Similarly, the upper surface 24 of the substrate table 22 is liquid-repellent with respect to the first liquid LQ and the second liquid LC. The contact angle of the upper surface 24 of the substrate table 22 with respect to each of the first liquid LQ and the second liquid LC is not less than 90 degrees. In this embodiment, the upper surface 24 of the substrate table 22 is formed of a film of a liquid-repellent material including, for example, fluorine-based resin (for example, PTFE, PFA or the like). It is desirable that the inner side surface of the second recess 150R of the substrate table 22 (a surface opposite to the side surface of the vibration member 150) is also liquid-repellent with respect to the first liquid LQ and the second liquid LC.

Similarly, the upper surface 34 of the measuring table 32 is liquid-repellent with respect to the first liquid LQ and the second liquid LC. The contact angle of the upper surface 34 of the measuring table 32 with respect to each of the first liquid LQ and the second liquid LC is not less than 90 degrees. In this embodiment, the upper surface 34 of the measuring table 32 is formed of a film of a liquid-repellent material including, for example, fluorine-based resin (for example, PTFE, PFA or the like). The liquid-repellent films, which are used for the vibration member 150, the substrate table 22, and the measuring table 32, may be formed of a same material (substance) respectively, or may be formed of different materials (substances).

Next, an explanation will be made about a method for exposing the substrate P by using the exposure apparatus EX constructed as described above.

For example, the controller 7 uses the second driving system 5 to arrange the measuring table 32 at the position opposite to the nozzle member 8, to thereby form the first liquid immersion space LS1 with the first liquid LQ between the nozzle member 8 and the measuring table 32. The controller 7 executes the measurement by the various measuring devices arranged on the measuring table 32 via the first liquid LQ in the first liquid immersion space LS1. Further, the controller 7 adjusts the exposure condition to be adapted when the substrate P is exposed, the exposure condition including, for example, the image formation characteristic of the projection optical system PL, etc., based on results of the measurement obtained by the measuring devices, and the controller 7 starts the exposure operation for the substrate P. Upon exposing the substrate P, the controller 7 uses the second driving system 5 to arrange the substrate stage 2 holding the substrate P at the position opposite to the nozzle member 8, to thereby form the first liquid immersion space LS1 between the nozzle member 8 and the substrate table 22 (substrate P).

In this embodiment, as disclosed, for example, in European Patent Application Publication No. 1,713,113 and United States Patent Application Publication No. 2006/0023186, the controller 7 synchronously moves the substrate table 22 and the measuring table 32 in the XY directions with respect to the final optical element 11 and the nozzle member 8 while allowing at least one of the upper surface 24 of the substrate table 22 and the upper surface 34 of the measuring table 32 to be opposite to the lower surface 11A of the final optical element 11 and the lower surface 8A of the nozzle member 8 in a state that the upper surface 24 of the substrate table 22 and the upper surface 34 of the measuring table 32 approach closely to each other or make contact with each other so that at least one of the substrate table 22 and the measuring table 32 continuously forms the space capable of holding or retaining the first liquid LQ between the final optical element 11 and the nozzle member 8. By doing so, the controller 7 can move the first liquid immersion space LS1 of the first liquid LQ between the upper surface 24 of the substrate table 22 and the upper surface 34 of the measuring table 32 while suppressing the leakage of the first liquid LQ. Upon moving the first liquid immersion space LS1 of the first liquid LQ between the upper surface 24 of the substrate table 22 and the upper surface 34 of the measuring table 32, adjustment is made so that the upper surface 24 of the substrate table 22 and the upper surface 34 of the measuring table 32 have an approximately same height (are approximately flush with each other).

The controller 7 radiates the exposure light EL from the mask M onto the substrate P through the first liquid LQ of the first liquid immersion space LS1. Accordingly, the image of the pattern of the mask M is projected onto the substrate P, and thus the substrate P is exposed therewith.

The controller 7 moves the first liquid immersion space LS1 onto the measuring table 32 after the exposure of the substrate P is completed. The controller 7 moves the substrate table 22, holding the substrate P for which the exposure has been completed, to a predetermined substrate exchange position; and the controller 7 unloads the substrate P, for which the exposure has been completed, from the substrate table 22, the controller 7 loads a substrate P, which is to be exposed, onto the substrate table 22. During the substrate exchange performed at the substrate exchange position, if necessary, the controller 7 executes the measuring operation using the measuring table 32 via or through the first liquid LQ of the first liquid immersion space LS1. After completing the loading of the substrate P onto the substrate table 22, the controller 7 moves the first liquid immersion space LS1 onto the substrate table 22 (substrate P), and exposes the substrate P through the first liquid LQ of the first liquid immersion space LS1 in the same manner as described above. The controller 7 repeats the operation as described above to successively expose a plurality of pieces of the substrate P.

When the substrate P is exposed, the first liquid LQ of the first liquid immersion space LS1 makes contact with each of the surface of the substrate P, the lower surface 11A of the final optical element 11, and the lower surface 8A of the nozzle member 8. There is such a possibility, for example, that a part of the substance of the substrate P (for example, a part of the photosensitive material) might be eluted into the first liquid LQ making contact with the substrate P. If such a liquid LQ makes contact with the lower surface 11A of the final optical element 11 and/or the lower surface 8A of the nozzle member 8, then there is such a possibility that the lower surfaces 11A, 8A might be contaminated or dirtied with the substance eluted from the substrate P. Without being limited to the substance eluted from the substrate P, there is such a possibility that the lower surfaces 11A, BA may be also contaminated, for example, with any substance (foreign matter) floating in the space in which the exposure apparatus EX is placed such that the foreign matter directly adheres to the lower surfaces 11A, 8A and/or the foreign matter enters into and mixes with the first liquid LQ.

In view of the above, in this embodiment, at least one of the final optical element 11 and the nozzle member 8 is cleaned or washed by using the second liquid LC. In this embodiment, the second liquid immersion space LS2 is formed with the second liquid LC between the upper surface 151 of the vibration member 150 and the final optical element 11 and the nozzle member 8, and the vibration is applied to the second liquid LC of the formed second liquid immersion space LS2 to thereby clean at least one of the final optical element 11 and the nozzle member 8.

Next, an explanation will be made about a method for cleaning the final optical element 11 and the nozzle member 8 by using the second liquid LC.

Figure 4:
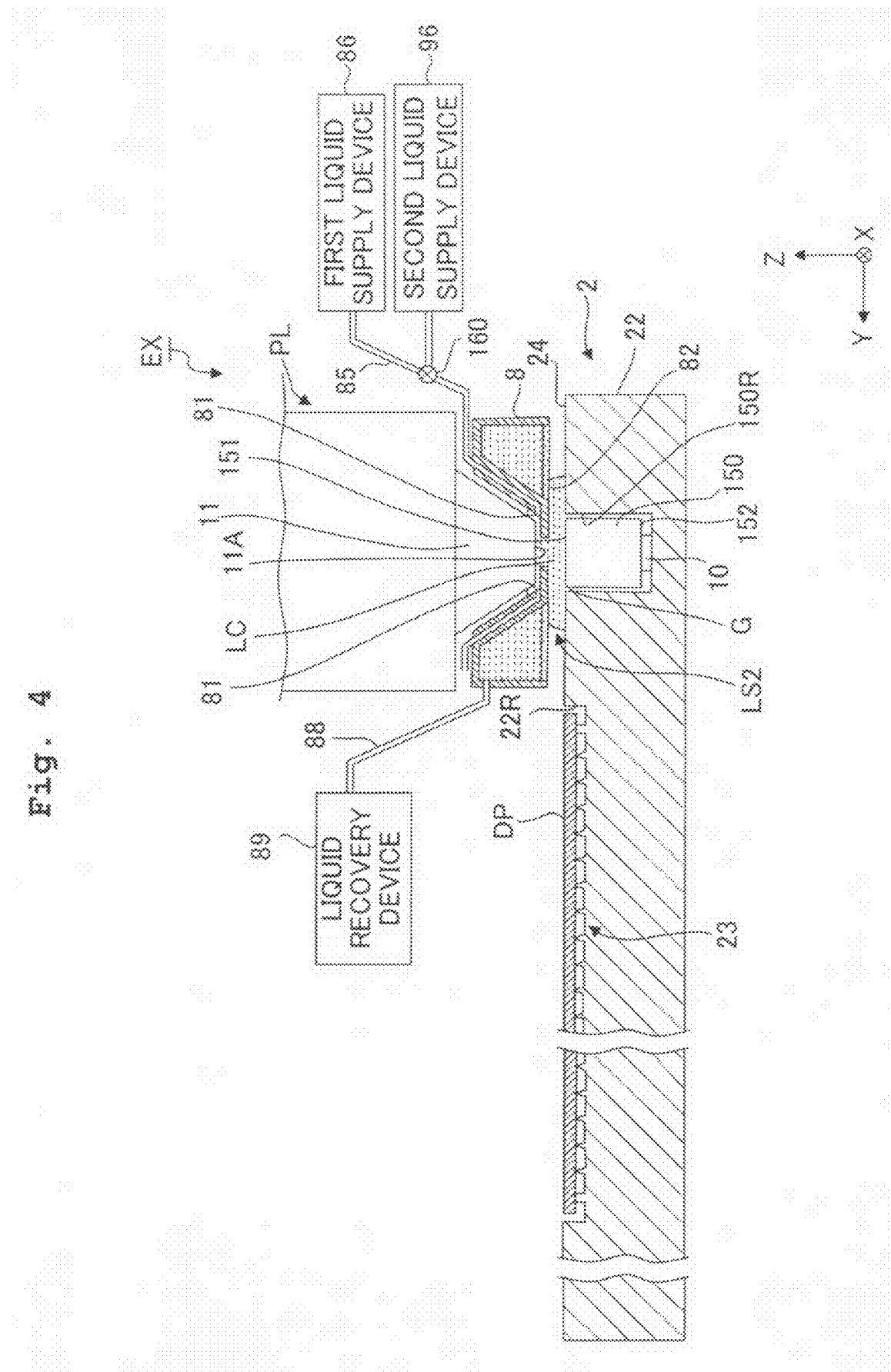
FIG. 4 illustrates an example of the cleaning operation according to the first embodiment.

In order to clean the final optical element 11 and the nozzle member 8 by using the second liquid LC, the controller 7 moves the substrate table 22 so that the vibration member 150 is opposite to the final optical element 11 to form the second liquid immersion space LS2 with the second liquid LC between the final optical element 11 and the nozzle member 8 and the vibration member 150. In order to form the second liquid immersion space LS2 with the second liquid LC, the controller 7 stops the supply of the first liquid LQ from the supply port 81, and the controller 7 supplies the second liquid LC from the supply port 81. As shown in FIG. 4, the second liquid immersion space LS2 is formed between the final optical element 11 and the nozzle member 8 and the vibration member 150 with the second liquid LC supplied from the supply port 81. The nozzle member 8 executes the recovery operation to recover the second liquid LC using the recovery port 82 concurrently with the supply operation to supply the second liquid LC using the supply port 81, and thus the second liquid immersion space LS2 is formed. As shown in FIG. 4, in this embodiment, the size of the second liquid immersion space LS2 in the XY plane is greater than the upper surface 151 of the vibration member 150. The second liquid immersion space LS2 is formed between the final optical element 11 and the nozzle member 8 and the vibration member 150 and the substrate table 22.

The controller 7 vibrates the vibration member 150 by the ultrasonic wave generator 10 in a state that the second liquid immersion space LS2 is formed. The ultrasonic wave generator 10 vibrates the vibration member 150 to thereby apply the ultrasonic wave (vibration) to the second liquid LC of the second liquid immersion space LS2 formed on the vibration member 150. In this embodiment, the ultrasonic wave generator 10 is capable of applying the vibration in a range of 20 kHz to 5000 kHz to the vibration member 150. The ultrasonic wave generator 10 applies the ultrasonic wave (vibration) to the second liquid LC of the second liquid immersion space LS2 formed between the final optical element 11 and the nozzle member 8 and the vibration member 150 and the substrate table 22 to make foreign matter (pollution matter or contaminating matter), adhering to at least one of the final optical element 11 and the nozzle member 8, to be exfoliated or removed from at least one of the final optical element 11 and the nozzle member 8, thereby cleaning at least one of the final optical element 11 and the nozzle member 8. For example, the vibrator 10 generates cavitation (generation of minute bubbles and generation of shock wave or impulse wave upon disappearance of the minute bubbles) in the second liquid LC by applying the ultrasonic wave (vibration) to the second liquid LC. The cavitation causes the foreign matter (contaminating matter), adhering to at least one of the final optical element 11 and the nozzle member 8, to exfoliate the foreign matter from at least one of the final optical element 11 and the nozzle member 8, thereby cleaning at least one of the final optical element 11 and the nozzle member 8.

The supply and the recovery of the second liquid LC are continued during a period in which the vibration member 150 is vibrated by the ultrasonic wave generator 10 (during the cleaning operation). However, it is also allowable that the supply and the recovery of the second liquid LC are stopped temporarily or intermittently.

The substrate table 22 may be moved by the second driving system 5 in the XY plane with respect to the projection optical system PL and the nozzle member 8 during the period in which the vibration member 150 is vibrated by the ultrasonic wave generator 10. Accordingly, the lower surface 8A of the nozzle member 8 and the lower surface 11A of the final optical element 11 can be cleaned more uniformly and reliably irrelevant to the difference in the size of the upper surface 151 of the vibration member 150 with respect to the first liquid immersion space LS1 and the second liquid immersion space LS2. The vibration of the vibration member 150 may be stopped during the movement of the substrate table 22, and the vibration member 150 may be vibrated only when the substrate table 22 is stopped at a predetermined position.

As shown in FIG. 4, in this embodiment, a dummy substrate DP is held by the holding portion 23 of the substrate table 22 in the cleaning operation using the second liquid LC. The dummy substrate DP is a member (clean member) which is distinct from the substrate P for the exposure and which has a high cleanness to scarcely release any foreign matter. The dummy substrate DP has an outer shape approximately same as that of the substrate P for the exposure, and the dummy substrate DP can be held by the holding portion 23. In this embodiment, the holding portion 23 has a pin chuck mechanism, and detachably holds each of the substrate P and the dummy substrate DP. A surface of the dummy substrate DP is liquid-repellent with respect to the second liquid LC. The cleaning operation can be executed also by using the cleaning liquid LC in a state that the holding portion 23 is exposed, without holding the dummy substrate DP by the holding portion 23.

As explained above, according to this embodiment, it is possible to satisfactorily clean the liquid immersion member which includes the final optical element 11, the nozzle member 8, etc., and which is capable of forming the liquid immersion space with respect to the substrate table 22. Therefore, it is possible to suppress the deterioration of the performance of the exposure apparatus EX which would be otherwise caused by the contamination of the final optical element 11 and the nozzle member 8.

In this embodiment, there is provided the ultrasonic wave generator 10 which applies the ultrasonic wave to the second liquid LC of the second liquid immersion space LS2. Therefore, it is possible to enhance the cleaning effect. In this embodiment, the final optical element 11 and the nozzle member 8 can be satisfactorily cleaned owing to the synergistic effect of the ultrasonic wave and the second liquid LC (hydrogen water) suitable for the cleaning.

In this embodiment, the vibration member 150, which is small-sized and can be provided on the substrate table 22, is vibrated in order to apply the ultrasonic wave to the second liquid LC of the second liquid immersion space LS2. Accordingly, the vibration member 150 can be smoothly vibrated at a high frequency (oscillation frequency), and thus it is possible to smoothly apply the ultrasonic wave at the high frequency to the second liquid LC of the second liquid immersion space LS2. In a case that a more satisfactory cleaning effect is obtained when the ultrasonic wave applied to the second liquid LC of the second liquid immersion space LS2 has a higher frequency, then it is effective that the vibration member 150, which is provided on the substrate table 22, is vibrated at a high frequency (oscillation frequency), for example, of not less than 1 MHz. Alternatively, the vibration may be effected while switching a plurality of frequencies or continuously modulating the vibration frequency of the vibration member 150 by the controller 7 or the driving circuit of the piezoelectric element of the ultrasonic wave generator 10. By doing so, any foreign matter, which is included in a plurality of types of foreign matters adhered to the final optical element 11 and the nozzle member 8 and which is hardly separated or exfoliated with a specific single frequency, can be also easily separated or exfoliated, thereby making the effect of the cavitation based on the ultrasonic wave to be more remarkable.

In this embodiment, the upper surface 151 of the vibration member 150 is flush with the upper surface 24 of the substrate table 22. Therefore, it is possible to form the second liquid immersion space LS2 satisfactorily.

The vibration member 150 and the substrate table 22 are arranged with the predetermined gap G being intervened therebetween. Therefore, the vibration member 150 can be smoothly vibrated. Further, the vibration of the vibration member 150 does not exert any harmful influence on the substrate table 22 because the vibration member 150 and the substrate table 22 are arranged with the predetermined gap G intervening therebetween. Further, the gap G between the vibration member 150 (upper surface 151) and the substrate table 22 (upper surface 24) is minute (about 0.1 mm); and the upper surface 151 of the vibration member 150 and the upper surface 24 of the substrate table 22 are liquid-repellent with respect to the first liquid LQ and the second liquid LC. Therefore, it is possible to prevent or suppress the first liquid LQ and the second liquid LC from remaining on the upper surfaces 151, 24, and it is possible to suppress the inflow of the liquid into the substrate table 22 from the gap G between the vibration member 150 (upper surface 151) and the substrate table 22 (upper surface 24).

A seal member, which suppresses the inflow of the liquid into the substrate table 22, can be arranged between the vibration member 150 and the substrate table 22. For example, when a resilient (flexible) seal member such as an O-ring is arranged, it is possible to suppress the inflow of the liquid into the substrate table 22 without disturbing the vibration of the vibration member 150. Alternatively, a soft seal film, which is larger than the opening of the second recess 150R, may be prepared; and the opening of the second recess 150R may be covered with the seal film, and the back surface of the seal film may be adhered to the upper surface 151 of the vibration member 150. By doing so, the vibration of the vibration member 150 is transmitted or transferred to the liquid, while avoiding the inflow of the liquid into the gap G. In this case, it is preferable that a material of the seal film is formed of the above-described liquid-repellent material. A part of the seal film positioned on the upper surface 151 of the vibration member 150 may be removed to expose a part of the upper surface 151 of the vibration member 150.

It is also possible to provide a recovery port 154 for recovering the liquid between the vibration member 150 and the substrate table 22. For example, by providing the recovery port 154 at the inside of the second recess 150R (on the side surface or the bottom surface of the inner wall defining the second recess 150R) to surround the vibration member 150, the liquid inflowed into any space between the vibration member 150 and the substrate table 22 can be recovered satisfactorily.

This embodiment is illustrative of an exemplary case in which only one vibration member 150 is provided on the substrate table 22. However, the vibration member 150 may be provided on the substrate table 22 at each of a plurality of positions thereof.

This embodiment is illustrative of the exemplary case in which the supply port 81 formed in the nozzle member 8 is capable of supplying both of the second liquid LC and the first liquid LQ. However, a supply port for supplying the second liquid LC and a supply port for supplying the first liquid LQ may be separately formed in the nozzle member 8. Similarly, the nozzle member 8 may be provided with a recovery port for recovering the first liquid LQ and a recovery port for recovering the second liquid LC which are separate ports.

Second Embodiment

Next, a second embodiment will be explained. In the following description, the constitutive parts or components, which are same as or equivalent to those of the embodiment described above, are designated by same reference numerals, and any explanation therefor will be simplified or omitted. The first embodiment described above is explained by an example wherein the supply port 81, from which the second liquid LC is supplied to form the second liquid immersion space LS2, is arranged on the nozzle member 8. However, the feature of the second embodiment is that a supply port 81B, from which the second liquid LC is supplied to form the second liquid immersion space LS2, is arranged on the substrate table 22.

Figure 5:
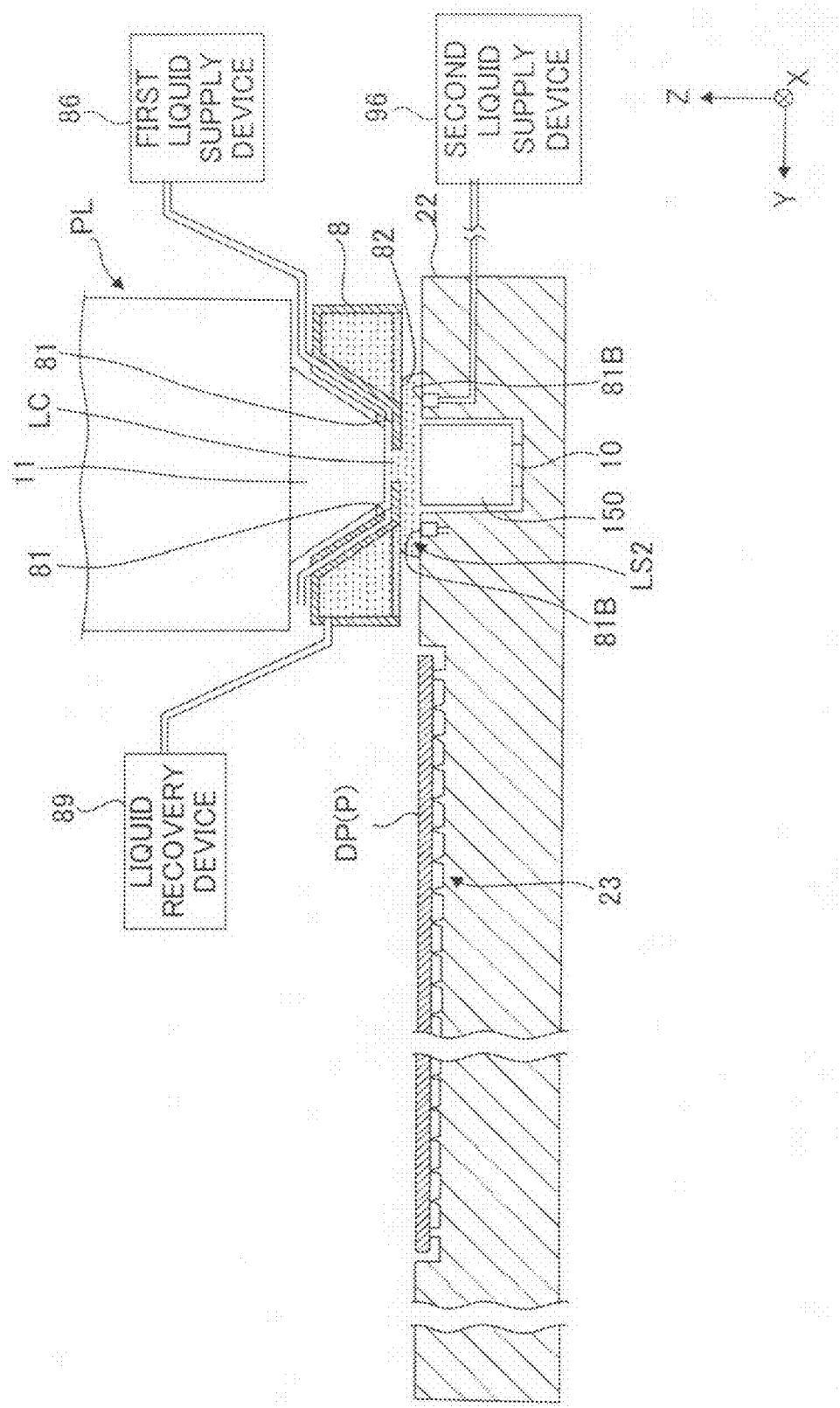
FIG. 5 is a side sectional view of those disposed in the vicinity of a substrate table and a nozzle member according to a second embodiment.
Figure 6:
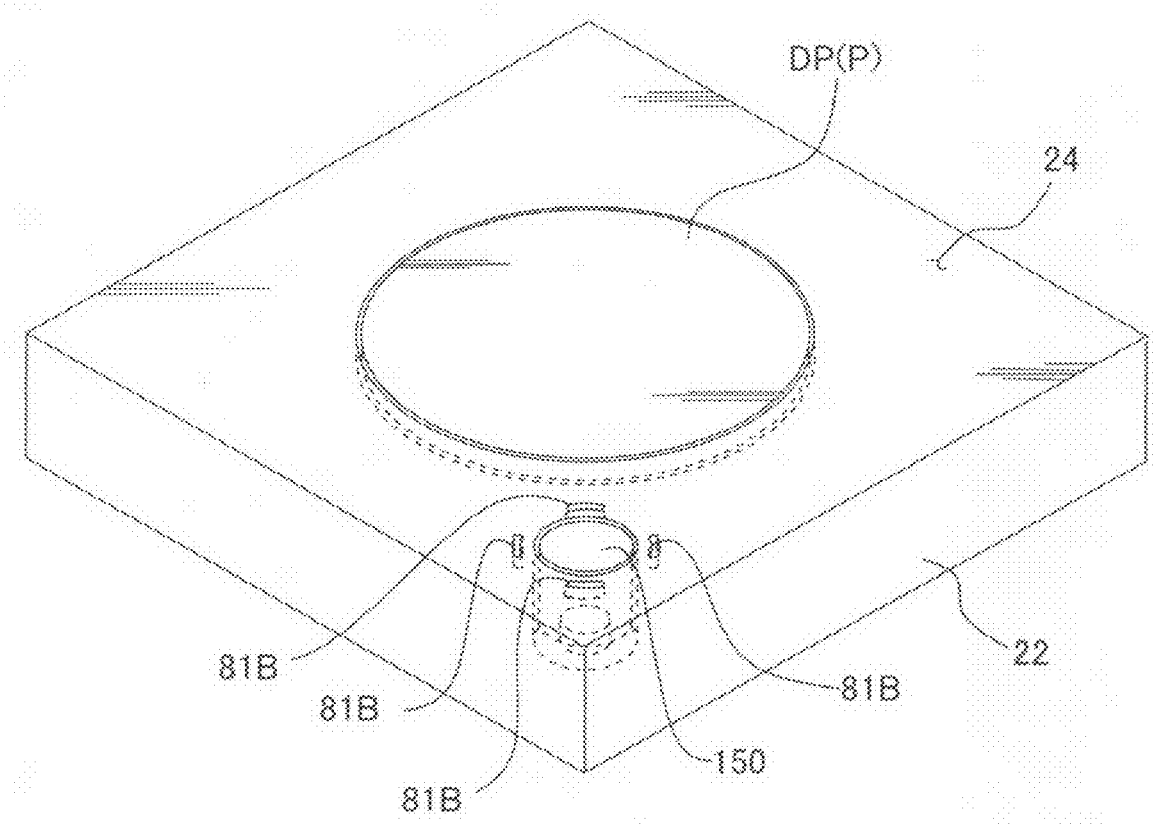
FIG. 6 is a perspective view of the substrate table according to the second embodiment.

FIG. 5 is a sectional view of those disposed in the vicinity of the substrate table 22 according to the second embodiment. FIG. 6 is a perspective view of the substrate table 22 according to the second embodiment. As shown in FIGS. 5 and 6, an exposure apparatus EX according to the second embodiment is provided with the supply port 81B arranged on the substrate table 22 in order to supply the second liquid LC. The supply port 81B supplies the second liquid LC in order to form the second liquid immersion space LS2 with the second liquid LC.

In this embodiment, the supply port 81B is provided as a plurality of supply ports 81B arranged around the second recess 150R. Each of the supply ports 81B is connected, via a flow passage, to the second liquid supply device 96 which is capable of feeding the second liquid LC. Even with the second liquid LC supplied from the supply ports 81B arranged on the substrate table 22, the second liquid immersion space LS2 can be satisfactorily formed between the final optical element 11 and the nozzle member 8 and the vibration member 150 and the substrate table 22.

A recovery port 154, from which the second liquid LC is to be recovered, can be provided on the substrate table 22 (for example, around the second recess 150R). One or more of the recovery ports 154 can be provided at the outside of the supply ports 81B with respect to the second recess 150R.

At least one of the recovery port and the supply port for the second liquid LC to be provided on the substrate table 22 may be formed continuously around the second recess 150R.

When at least one of the recovery port and the supply port for the second liquid LC is arranged on the substrate table 22, then at least one of the supply port 81 and the recovery port 82 provided on the nozzle member 8 may be used to supply and/or recover the second liquid LC during the cleaning performed with the second liquid LC. Alternatively, it is also allowable that the supply port 81 and the recovery port 82 are not used. The first liquid LQ may be supplied and recovered by using the supply port 81 and the recovery port 82 upon the completion of the cleaning with the second liquid LC, thereby cleaning out (rinsing) the second liquid LC adhering to the substrate table 22, the final optical element 11, and the nozzle member 8.

Third Embodiment

Next, a third embodiment will be explained. In the following description, the constitutive parts or components, which are same as or equivalent to those of the embodiments described above, are designated by same reference numerals, and any explanation therefor will be simplified or omitted. The first and second embodiments described above are illustrative of an exemplary case in which the vibration member 150 is provided on the substrate table 22. However, the feature of the third embodiment is that the vibration member 150 is provided on a measuring table 32.

FIG. 7 is a perspective view of the measuring table 32 according to the third embodiment. With reference to FIG. 7, a vibration member 150C is provided on the measuring table 32. The measuring table 32 has a recess 153 in which the vibration member 150C can be arranged. The recess 153 is formed at a part of the upper surface 34, of the measuring table 32, which is opposable to the lower surface 11A of the final optical element 11 and the lower surface 8A of the nozzle member 8. The upper surface 34 of the measuring table 32 is arranged around the upper surface 151C of the vibration member 150C arranged in the recess 153. A gap is formed between the vibration member 150C and the measuring table 32. The upper surface 151C of the vibration member 150C and the upper surface 34 of the measuring table 32 are arranged so that a gap G2 is formed therebetween. The gap G2 is, for example, about 0.1 mm. An ultrasonic wave generator 10C, which is provided to vibrate the vibration member 150C, is connected to the vibration member 150C at the inside of the recess 153.

The upper surface 34 of the measuring table 32 is flat, and is substantially parallel to the XY plane. In this embodiment, the upper surface 151C of the vibration member 150C is substantially flush with the upper surface 34 of the measuring table 32.

The upper surface 151C of the vibration member 150C and the upper surface 34 of the measuring table 32 are substantially flush with surfaces 301A, 302A of the measuring devices 301, 302, respectively, which are provided on the measuring table 32. Each of the measuring devices 301, 302 is provided with an optical member such as a glass plate which is arranged on the measuring table 32, and a light-receiving element which is capable of receiving a light (exposure light EL) via the optical member. The surfaces 301A, 302A include the surfaces of the optical members arranged on the measuring table 32. The measuring table 32 includes a measuring member 303. The upper surface 151C of the vibration member 150C and the upper surface 34 of the measuring table 32 are substantially flush with a surface 303A of the measuring member 303.

Also in this embodiment, the upper surface 151C of the vibration member 150C is liquid-repellent with respect to the first liquid LQ and the second liquid LC. The contact angle of the vibration member 150C with respect to each of the first liquid LQ and the second liquid LC is not less than 90 degrees. Also in this embodiment, the upper surface 151C of the vibration member 150C is formed of a film of a liquid-repellent material including, for example, fluorine-based resin (for example, PTFE, PFA or the like). It is desirable that the side surface of the vibration member 150C is also liquid-repellent with respect to the first liquid LQ and the second liquid LC.

As described above, the upper surface 34 of the measuring table 32 is liquid-repellent with respect to the first liquid LQ and the second liquid LC. The liquid-repellent films, which are used for the vibration member 150C and the measuring table 32, may be formed of a same material (substance), or may be formed of different materials (substances).

Upon executing the cleaning operation, the controller 7 forms the second liquid immersion space LS2 by making the final optical element 11 and the nozzle member 8 to be opposite to or face the vibration member 150C and the measuring table 32. In this state, the vibration member 150C, which is provided on the measuring table 32, is vibrated by the ultrasonic wave generator 10C connected to the vibration member 150C. Accordingly, the ultrasonic wave can be applied to the second liquid LC in the second liquid immersion space LS2, and thus the final optical element 11 and the nozzle member 8 can be cleaned satisfactorily. The supply and the recovery of the second liquid LC are continued during the cleaning operation. However, the supply and the recovery of the second liquid LC may be stopped temporarily or intermittently.

During the period in which the vibration member 150C is vibrated by the ultrasonic wave generator 10C, the measuring table 32 may be moved by the second driving system 5 in the XY plane with respect to the projection optical system PL and the nozzle member 8. With this, the lower surface 8A of the nozzle member 8 and the lower surface 11A of the final optical element 11 can be cleaned or washed uniformly and reliably irrelevant to the difference in the size of the upper surface 151 of the vibration member 150C with respect to the first liquid immersion space LS1 and the second liquid immersion space LS2. The vibration of the vibration member 150C may be stopped during the movement of the measuring table 32, and the vibration member 10 may be vibrated only when the measuring table 32 is stopped at a predetermined position.

The vibration member 150C and the measuring table 32 are arranged while allowing the gap G2 to intervene therebetween. Therefore, the vibration member 150C can be vibrated smoothly. Further, the vibration of the vibration member 150C does not exert any harmful influence on the measuring table 32, because the vibration member 150C and the measuring table 32 are arranged while allowing the gap G2 to intervene therebetween. An anti-vibration mechanism may be provided for the measuring table 32 so that the vibration of the vibration member 150C is not transmitted to the measuring devices 301, 302. The gap G2 between the vibration member 150C (upper surface 151C) and the measuring table 32 (upper surface 34) is minute (about 0.1 mm). Further, the upper surface 151C of the vibration member 150C and the upper surface 34 of the measuring table 32 are liquid-repellent with respect to the first liquid LQ and the second liquid LC. Therefore, it is possible to prevent or suppress the first liquid LQ and the second liquid LC from remaining on the upper surfaces 151C, 34, and it is possible to suppress the inflow of the liquid into the measuring table 32 from the gap G2 between the vibration member 150C (upper surface 151C) and the measuring table 32 (upper surface 34).

The second liquid LC, which is to be supplied in order to form the second liquid immersion space LS2, can be supplied from the supply port 81 arranged on the nozzle member 8 in the same manner as in the first embodiment. A supply port for supplying the second liquid LC may be provided on the measuring table 32 (for example, around the recess 153), and the second liquid immersion space LS2 may be formed with the second liquid LC supplied from the supply port as well. A recovery port 154C for recovering the second liquid LC may be provided on the measuring table 32 (for example, around the recess 153). One or more of the recovery ports may be formed continuously or in a dispersed form at the outside of the supply port 81B with respect to the second recess 150R. When at least one of the recovery port and the supply port for the second liquid LC is provided on the measuring table 32, then at least one of the supply port 81 and the recovery port 82 provided on the nozzle member 8 may be used to supply and/or recover the second liquid LC during the cleaning performed with the second liquid LC. Alternatively, it is also allowable that at least one of the supply port 81 and the recovery port 82 is not used. By supplying and recovering the first liquid LQ by using the supply port 81 and the recovery port 82 respectively upon the completion of the cleaning with the second liquid LC, the second liquid LC adhering to the measuring table 32, the final optical element 11, and the nozzle member 8 may be washed out (rinsed).

A resilient (flexible) seal member such as an O-ring, etc., which suppresses the inflow of the liquid into the measuring table 32, can be arranged between the vibration member 150C and the measuring table 32. Alternatively, a soft seal film, which is liquid-repellent and which is larger than the opening of the recess 153, may be prepared. The opening of the recess 153 may be covered with the seal film, and the back surface of the seal film may be adhered to the upper surface 151 of the vibration member 150. In this case, a part of the seal film positioned on the upper surface 151 of the vibration member 150 may be removed to expose a part of the upper surface 151C of the vibration member 150C.

A recovery port 154C may be provided to surround the vibration member 150C, for example at the inside of the recess 153, to recover the liquid between the vibration member 150C and the measuring table 32.

This embodiment is illustrative of an example in which only one vibration member 150C is provided on the measuring table 32. However, the vibration member 150C may be provided as a plurality of vibration members 150C arranged on the measuring table 32 at a plurality of positions of the measuring table 32 respectively.

Fourth Embodiment

When the heat generation amount of the ultrasonic wave generator 10 (10C) is great in the first to third embodiments described above, the following is also allowable. That is, a temperature adjusting device, which adjusts the temperature of the ultrasonic wave generator 10 (10C), is provided; and/or a heat-insulating member or a heat-absorbing member, which suppresses the emanation or diffusion of the heat of the ultrasonic wave generator 10 (10C), is arranged around the ultrasonic wave generator 10 (10C) so that the heat of the ultrasonic wave generator 10 (10C) is not transmitted to any member (substrate table 22, measuring table 32) disposed around the ultrasonic wave generator 10 (10C). In particular, when the ultrasonic wave generator 10C is provided on the measuring table 32 as in the third embodiment, it is desirable that the temperature adjusting device and/or the heat-insulating member (heat-absorbing member) described above is arranged so that the heat is not transmitted or transferred to the measuring devices 301, 302.

An explanation will be made below as the fourth embodiment about an example of the suppressing device for suppressing the emanation or diffusion of the heat generated by the ultrasonic wave generator 10 (10C). The following description is illustrative of an exemplary case in which the suppressing device suppresses the diffusion of the heat generated by the ultrasonic wave generator 10 provided on the substrate table 22. The ultrasonic wave generator 10 includes the piezoelectric element, and is connected to the vibration member 150 in the same manner as in the first to third embodiments described above. The controller 7 vibrates (ultrasonically vibrates) the vibration member 150 by using the ultrasonic wave generator 10 to apply the vibration (ultrasonic wave) to the cleaning liquid LC on the vibration member 150. Accordingly, it is possible to clean at least one of the final optical element 11 and the nozzle member 8.

Figure 8:
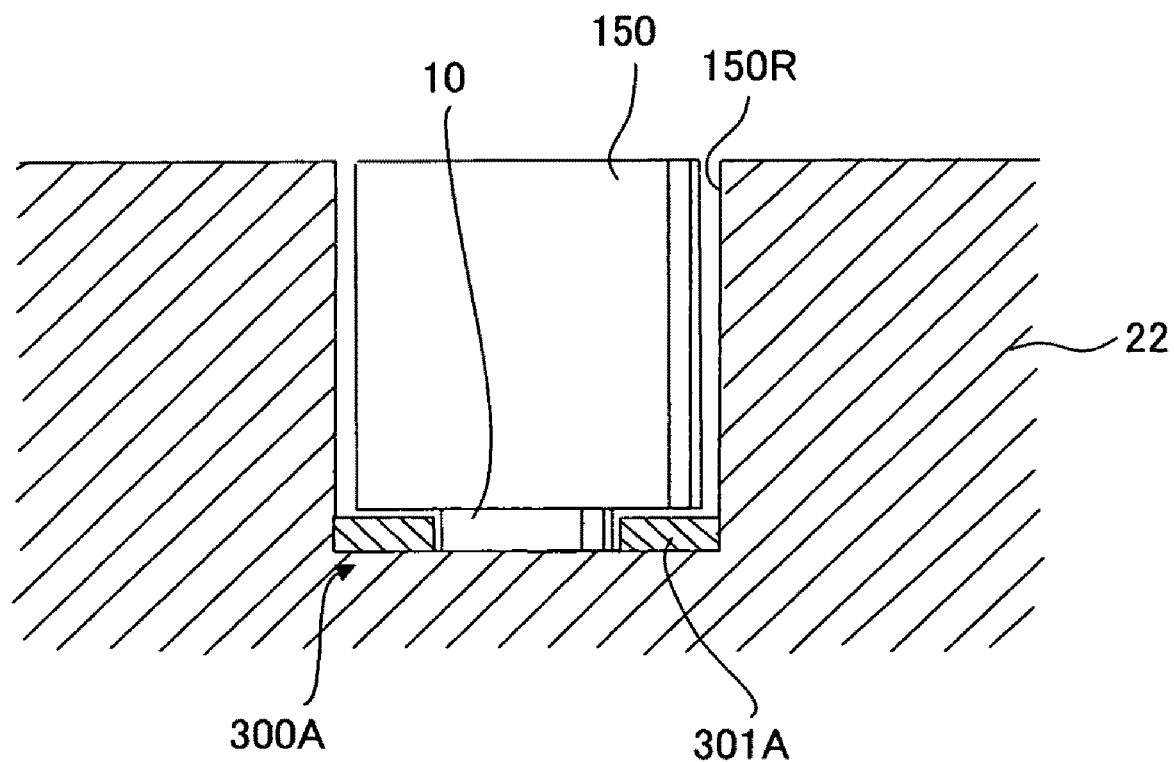
FIG. 8 is a side sectional view of an example of a suppressing device according to a fourth embodiment.

FIG. 8 is a sectional view schematically illustrating an example of a suppressing device 300A. With reference to FIG. 8, the suppressing device 300A has a first member 301A which is arranged in the recess 150R and which is arranged around the ultrasonic wave generator 10. The first member 301A is a cylindrical member. The first member 301A is arranged between the ultrasonic wave generator 10 and the substrate table 22. The first member 301A is formed of, for example, a metal such as aluminum or a synthetic resin having the heat-insulating property (heat-absorbing property).

By providing the first member 301A, it is possible to suppress the diffusion of the heat generated by the ultrasonic wave generator 10; and it is possible to suppress the transfer of the heat generated by the ultrasonic wave generator 10 to the member (substrate table 22) disposed around the ultrasonic wave generator 10.

Figure 9:
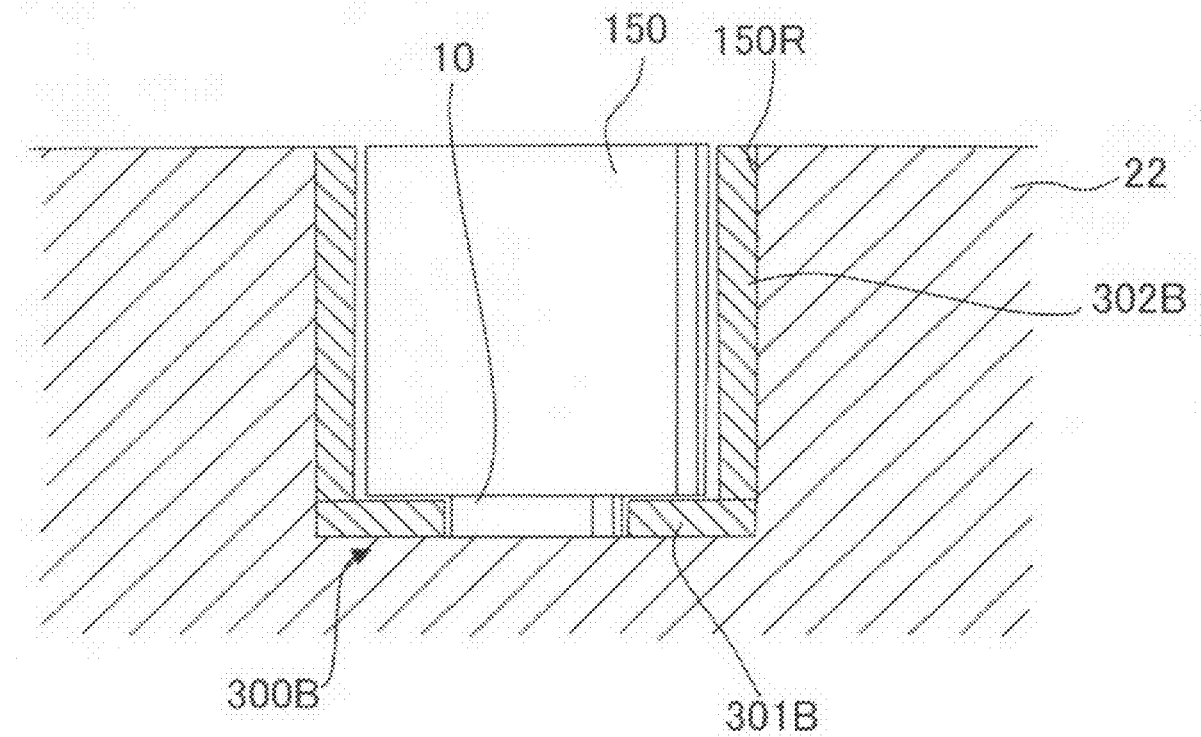
FIG. 9 is a side sectional view of an example of the suppressing device according to the fourth embodiment.

FIG. 9 is a sectional view schematically illustrating another example of a suppressing device 300B. With reference to FIG. 9, the suppressing device 300B has a first member 301B which is arranged in the recess 150R and which is arranged around the ultrasonic wave generator 10, and a second member 302B which is arranged in the recess 150R and around the vibration member 150. In FIG. 9, each of the first member 301B and the second member 302B is a cylindrical member. The first member 301B is arranged between the ultrasonic wave generator 10 and the substrate table 22, and the second member 302B is arranged between the vibration member 150 and the substrate table 22. In FIG. 9, the first member 301B and the second member 302B are fitted into the recess 150R. However, the wall surface of the recess 150R may be integrally formed by the first member 301B and the second member 302B. In FIG. 9, the circumferences of the first member 301B and the second member 302B are surrounded by the member constructing the substrate table 22. However, the circumference of at least one of the first member 301B and the second member 302B may be a gas space. That is, any space (for example, a cylindrical space) may be provided between the outer circumference of the first member 301B and/or the outer circumference of the second member 302B and the circumferential wall surface defining the recess 150R. More excellent heat-insulating effect can be expected via the space as described above.

The vibration member 150 and the second member 302B are arranged with a predetermined gap being intervened therebetween. Accordingly, the vibration member 150 can be vibrated smoothly. The gap, which is formed between the vibration member 150 and the second member 302B, is adjusted to have a predetermined value (about 0.1 mm), and thus any inflow of the liquid into the gap between the vibration member 150 and the second member 302B is suppressed.

Each of the first member 301B and the second member 302B is formed of, for example, a metal such as aluminum or a member (synthetic resin) having the heat-insulating property (heat-absorbing property). In the example shown in FIG. 9, the first member 301B and the second member 302B are connected to each other, and are integrated into one body. The first member 301B and the second member 302B may be separated from each other. The first member 301B and the second member 302B may be formed of different materials.

By providing the first member 301B, it is possible to suppress the diffusion of the heat generated by the ultrasonic wave generator 10; and it is possible to suppress the transfer of the heat generated by the ultrasonic wave generator 10 to the substrate table 22. Further, by providing the second member 302B, it is possible to suppress the transfer of the heat of the ultrasonic wave generator 10 to the substrate table 22 via the vibration member 150. In this viewpoint, it is desirable that the vibration member 150(C) is formed of a heat-insulating or adiabatic material such as silica glass as described above. Further, the outer circumferential surface and/or the bottom surface of the vibration member 150(C) may be coated with a heat-insulating material.

In the embodiments explained with reference to FIGS. 8 and 9, it is also allowable that the first member 301A (301B) is not cylindrical. By arranging any suppressing member capable of suppressing the heat diffusion at least at a part of the surroundings of the ultrasonic wave generator 10, it is possible to suppress the transfer of the heat generated by the ultrasonic wave generator 10 to the substrate table 22. Similarly, it is also allowable that the second member 302A (302B) is not cylindrical; and it is also appropriate that any suppressing member, capable of suppressing the heat diffusion, is arranged at least at a part of the surroundings of the vibration member 150.

Figure 10:
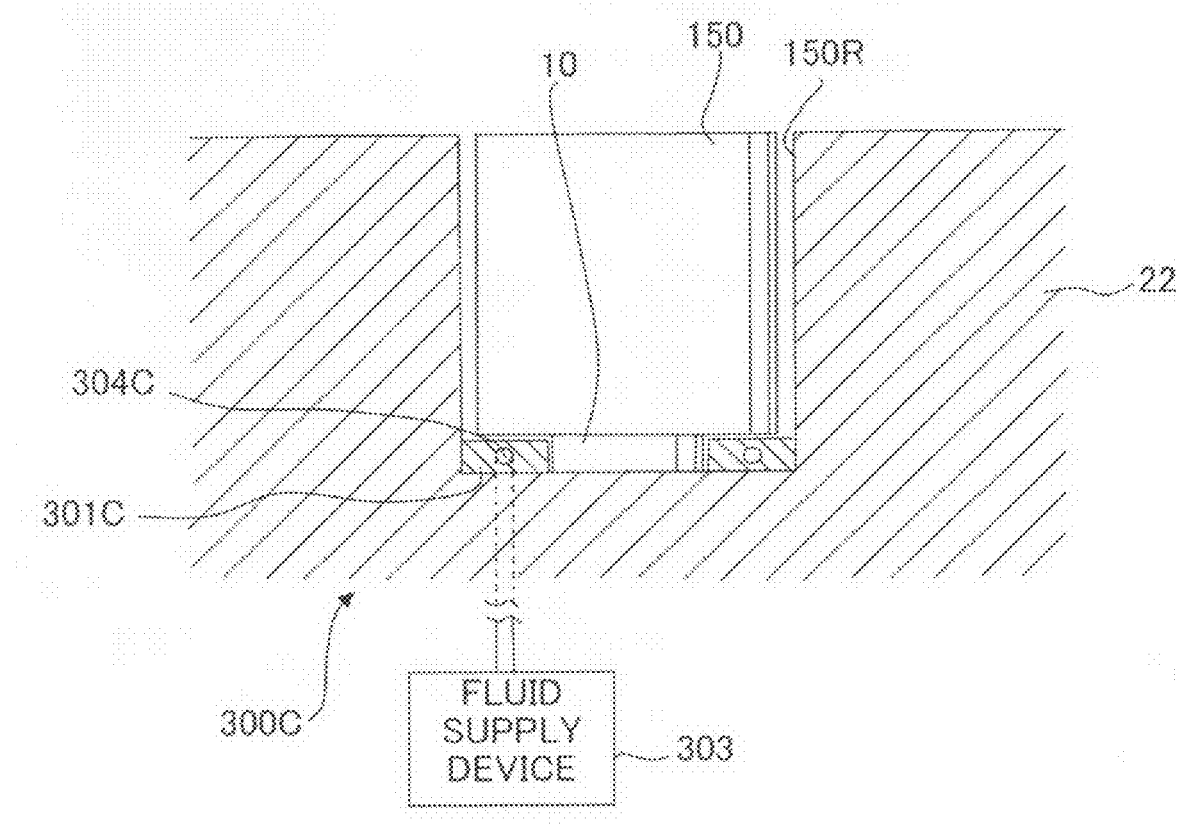
FIG. 10 is a side sectional view of an example of the suppressing device according to the fourth embodiment.

FIG. 10 is a sectional view schematically illustrating another example of a suppressing device 300C. With reference to FIG. 10, the suppressing device 300C has a first member 301C which is arranged around the ultrasonic wave generator 10, and a fluid supply device 303 which supplies a fluid for temperature adjustment (temperature-adjusting fluid). The first member 301C is a cylindrical member. The first member 301C is formed of a material having a high coefficient of thermal conductivity including, for example, a metal such as aluminum.

In this embodiment, the fluid supply device 303 supplies, to the first member 301C, the fluid which is adjusted to have a predetermined temperature. The suppressing device 300C adjusts the temperature of the first member 301C by using the fluid supplied from the fluid supply device 303. The suppressing device 300C can suppress the transfer of the heat generated by the ultrasonic wave generator 10 to the substrate table 22 by adjusting the temperature of the first member 301C.

The suppressing device 300C can adjust the temperature of the ultrasonic wave generator 10 by adjusting the temperature of the first member 301C arranged around the ultrasonic wave generator 10. That is, the suppressing device 300C functions as a temperature adjusting device for adjusting the temperature of the ultrasonic wave generator 10.

In this embodiment, the fluid supply device 303 supplies the liquid for the temperature adjustment. Those usable as the liquid to be supplied from the fluid supply device 303 include, for example, water (pure or purified water) and fluorine-based inactive liquid (for example, "Fluorinert" produced by Sumitomo 3M Limited).

In this embodiment, the first member 301C has an internal flow passage 304C. The internal flow passage 304C is arranged substantially annularly along the cylindrical first member 301C. The internal flow passage 304C may be formed to have a helical form. The fluid supply device 303 supplies the temperature-adjusting liquid to one end of the internal flow passage 304C of the first member 301C. The temperature-adjusting liquid, which is supplied from the fluid supply device 303, flows through the internal flow passage 304C of the first member 301C, and thus the temperature of the first member 301C is adjusted.

In this embodiment, after the liquid flows through the internal flow passage 304C of the first member 301C, the liquid is returned to the fluid supply device 303 via the other end of the internal flow passage 304C. The liquid is reused after the liquid flows through the internal flow passage 304C. The fluid supply device 303 adjusts the temperature of the liquid which flowed through the internal flow passage 304C of the first member 301C and returned to the fluid supply device 303, and then the fluid supply device 303 supplies the liquid again to the internal flow passage 304C of the first member 301C. The liquid may be recovered by a predetermined fluid recovery device without reusing the liquid after the liquid flowed through the internal flow passage 304C of the first member 301C. The liquid LQ of the first liquid supply device 86 may be utilized as a liquid source for the fluid supply device 303.

Owing to the suppressing device 300C, it is possible to suppress the diffusion of the heat generated by the ultrasonic wave generator 10, and it is possible to sufficiently suppress the transfer of the heat generated by the ultrasonic wave generator 10 to the substrate table 22.

Figure 11:
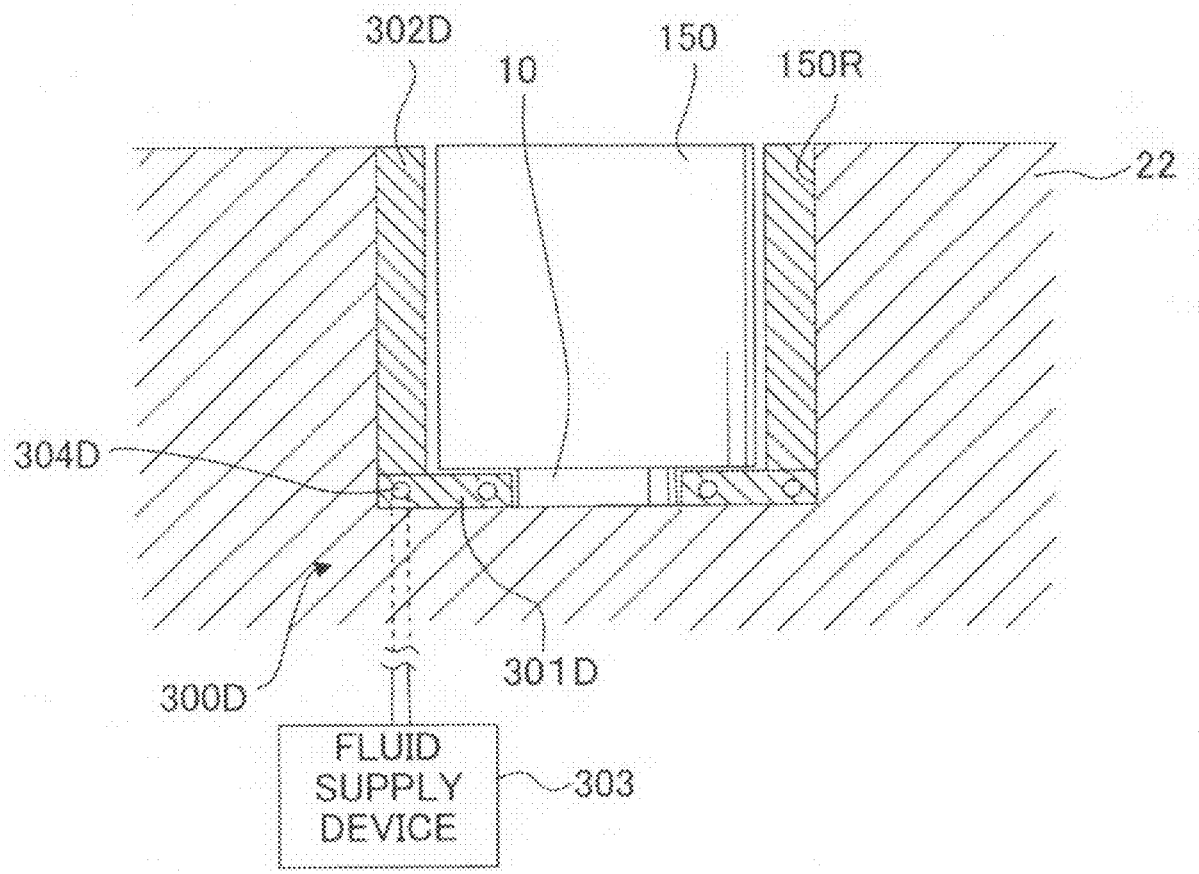
FIG. 11 is a side sectional view of an example of the suppressing device according to the fourth embodiment.

FIG. 11 is a sectional view schematically illustrating another example of a suppressing device 300D. With reference to FIG. 11, the suppressing device 300D has a first member 301D which is arranged around the ultrasonic wave generator 10; a second member 302D which is connected to the first member 301D and which is arranged around the vibration member 150; and a fluid supply device 303 which supplies a fluid for temperature adjustment (temperature-adjusting fluid). The first member 301D is a cylindrical member. The first member 301D has an internal flow passage 304D through which the temperature-adjusting liquid supplied from the fluid supply device 303 flows. The first member 301D is formed of a material having a high coefficient of thermal conductivity including, for example, a metal such as aluminum.

The second member 302D is a cylindrical member which is formed of a material having a high coefficient of thermal conductivity including, for example, a metal such as aluminum. The vibration member 150 and the second member 302D are arranged with a predetermined gap intervening therebetween; and the vibration member 150 can be vibrated smoothly. The gap, formed between the vibration member 150 and the second member 302D, is adjusted to have a predetermined value (about 0.1 mm); and any inflow of the liquid into the gap between the vibration member 150 and the second member 302D is suppressed.

The temperature of the second member 302C connected to the first member 301D can be also adjusted by adjusting the temperature of the first member 301D by using the temperature-adjusting liquid supplied from the fluid supply device 303. Even with the suppressing device 300D shown in FIG. 11, it is possible to suppress the diffusion of the heat generated by the ultrasonic wave generator 10, and it is possible to sufficiently suppress the transfer of the heat generated by the ultrasonic wave generator 10 to the substrate table 22.

Figure 12:
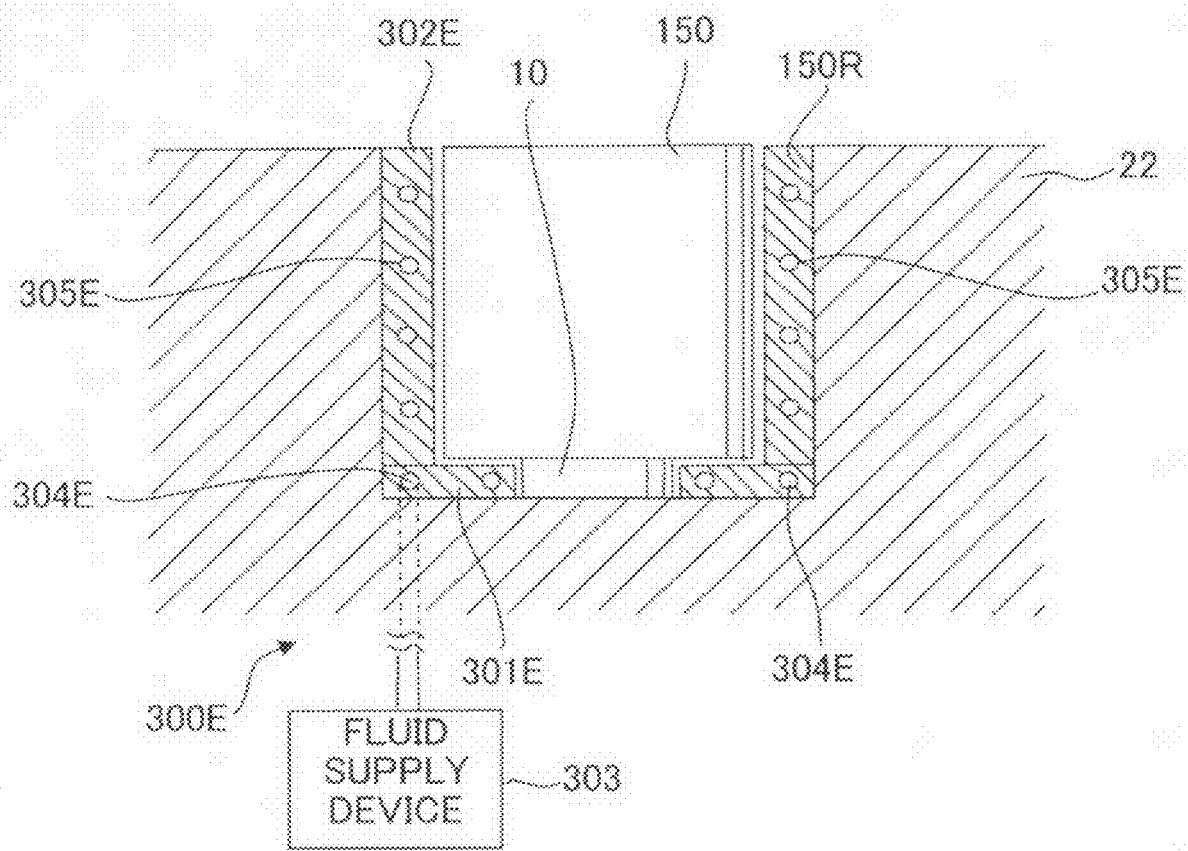
FIG. 12 is a side sectional view of an example of the suppressing device according to the fourth embodiment.

FIG. 12 is a sectional view schematically illustrating another example of a suppressing device 300E. With reference to FIG. 12, the suppressing device 300E has a first member 301E which is arranged around the ultrasonic wave generator 10; a second member 302E which is connected to the first member 301E and which is arranged around the vibration member 150; and a fluid supply device 303 which supplies a fluid for temperature adjustment (temperature-adjusting fluid).

The first member 301E is a cylindrical member. The first member 301E has an internal flow passage 304E through which the temperature-adjusting liquid supplied from the fluid supply device 303 flows. The first member 301E is formed of a material having a high coefficient of thermal conductivity including, for example, a metal such as aluminum.

The second member 302E is a cylindrical member. The second member 302E has an internal flow passage 305E through which the temperature-adjusting liquid supplied from the fluid supply device 303 flows. The second member 302E is formed of a material having a high coefficient of thermal conductivity including, for example, a metal such as aluminum.

The vibration member 150 and the second member 302E are arranged with a predetermined gap being intervened therebetween. The vibration member 150 can be vibrated smoothly. The gap, which is formed between the vibration member 150 and the second member 302E, is adjusted to have a predetermined value (about 0.1 mm), and any inflow of the liquid into the gap between the vibration member 150 and the second member 302E is suppressed.

The internal flow passage 304E of the first member 301E and the internal flow passage 305E of the second member 302E are connected to one another. In this embodiment, the fluid supply device 303 supplies the temperature-adjusting liquid to the internal flow passage 304E of the first member 301E. The liquid, which is supplied from the fluid supply device 303, flows through a part of the internal flow passage 304E of the first member 301, and the liquid flows through the internal flow passage 305E of the second member 302E. After that, the liquid flows through a part of the internal flow passage 304E of the first member 301E, and the liquid is returned to the fluid supply device 303. According to the suppressing device 300E shown in FIG. 12, the liquid, which is supplied from the fluid supply device 303, can be used to adjust both of the temperatures of the first member 301E and the second member 302E. Therefore, it is possible to suppress the diffusion of the heat generated by the ultrasonic wave generator 10, and it is possible to sufficiently suppress the transfer of the heat generated by the ultrasonic wave generator 10 to the substrate table 22.

In the embodiments explained with reference to FIGS. 9, 11, and 12, the first member and the second member are different members. However, the first member and the second member may be formed with one member.

In the embodiments explained with reference to FIGS. 10 to 12, the temperature-adjusting liquid flows through the internal flow passages 304C, 304D, 304E formed in the first members 301C, 301D, 301E, respectively. However, for example, a tube member may be wound around the first member, and the liquid may flow through a flow passage of the tube member. In this case, it is possible to omit the internal flow passage of the first member. Alternatively, the temperature-adjusting liquid may flow through both of the internal flow passage formed in the first member and the flow passage of the tube member, without omitting the internal flow passage of the first member. Similarly, a tube member, having a flow passage through which the temperature-adjusting liquid flows, can be arranged around the second member.

The first member may be omitted, and a tube member may be wound around the ultrasonic wave generator 10; and the temperature-adjusting liquid may flow through a flow passage of the tube member.

Figure 13:
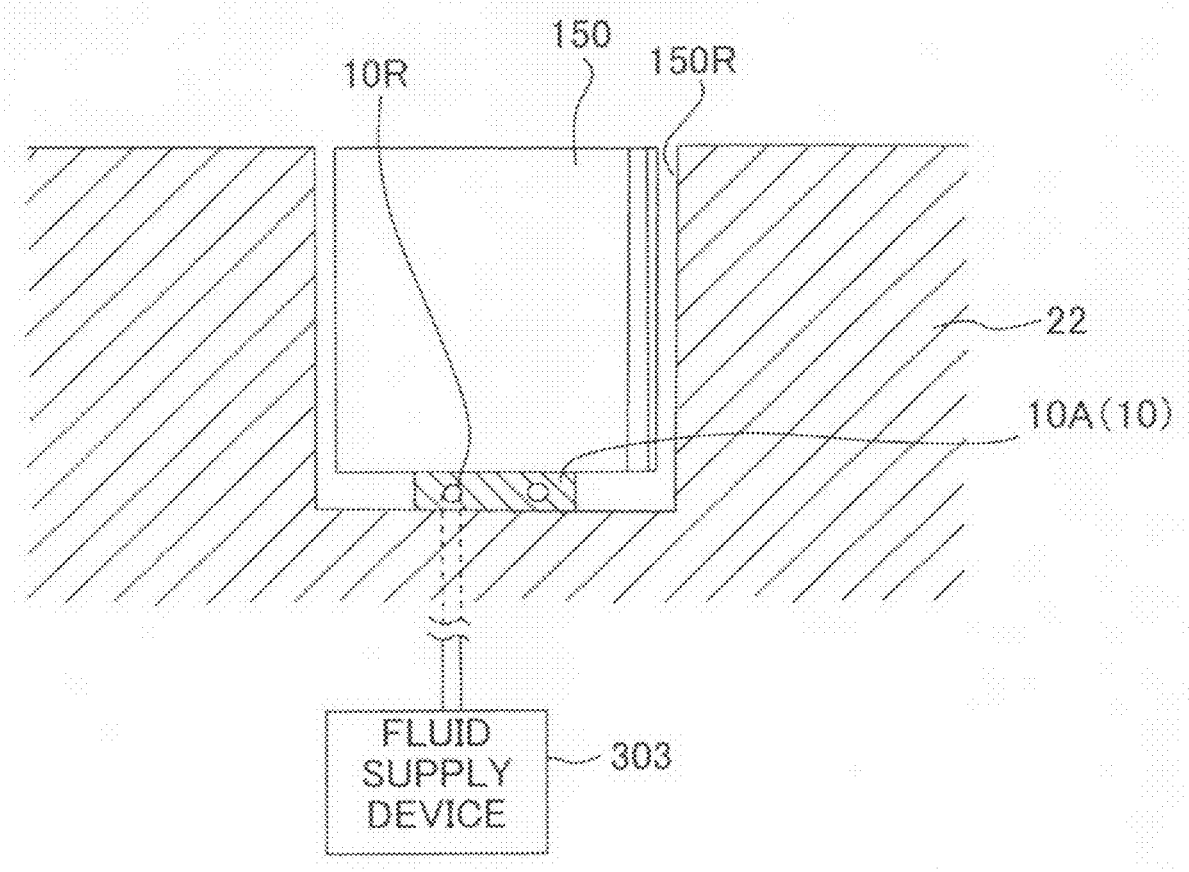
FIG. 13 is a side sectional view of an example of the suppressing device according to the fourth embodiment.

Alternatively, as shown in FIG. 13, an internal flow passage 10R may be formed in a part of the piezoelectric element 10A of the ultrasonic wave generator 10; and the temperature-adjusting fluid, which is supplied from the fluid supply device 303, may flow through the internal flow passage 10R. The fluid supply device 303 is capable of allowing the temperature-adjusting liquid to flow through the internal flow passage 10R of the piezoelectric element 10A, to thereby adjust the temperature of the piezoelectric element 10A (ultrasonic wave generator 10). Accordingly, it is possible to suppress the ultrasonic wave generator 10 from causing the diffusion of the heat.

The embodiments explained with reference to FIGS. 10 to 13 are illustrative of the exemplary case in which the fluid supplied from the fluid supply device 303 is the liquid. However, the fluid may be a gas. In the embodiments described above, the vibration member 150(C) is formed of silica glass. However, the vibration member 150(C) may be formed of any other heat-insulating material including, for example, ceramics and glass. Alternatively, the vibration member 150(C) can be also formed of a heat conductive material including, for example, a metal such as aluminum. During the cleaning in which the vibration member 150 is vibrated, the cleaning liquid LC of the second liquid immersion area LS2 usually exists on the vibration member. Therefore, it can be expected that the vibration member 150(C) is cooled by the liquid LC. For this purpose, it is also allowable that the cleaning liquid LC for forming the second liquid immersion area LS2 is temperature-adjusted. For example, the temperature of the cleaning liquid LC for forming the second liquid immersion area LS2 can be made higher than the temperature of the liquid immersion liquid LQ for forming the first liquid immersion area LS1.

Alternatively, it is also appropriate to suppress the diffusion of the heat generated by the ultrasonic wave generator 10 by using any other system including, for example, the Peltier element.

The embodiments explained with reference to FIGS. 8 to 13 are illustrative of the exemplary case in which the diffusion of the heat generated by the ultrasonic wave generator 10 provided on the substrate table 22 is suppressed and/or the temperature of the ultrasonic wave generator 10 is adjusted. However, it is a matter of course that the diffusion of the heat generated by the ultrasonic wave generator 10C provided on the measuring table 32 can be suppressed and/or the temperature of the ultrasonic wave generator 10C can be adjusted by using any one of the devices or apparatuses explained with reference to FIGS. 8 to 13. As described above, various sensors, measuring members, etc. are provided on the measuring table 32. However, when the diffusion of the heat generated by the ultrasonic wave generator 10 is suppressed as explained with reference to FIGS. 9 to 13, it is possible to suppress the occurrence of any error, in the measurement using the sensor (measuring member) of the measuring table 32, which would be otherwise caused by the heat generated by the ultrasonic wave generator 10.

In the first to fourth embodiments described above, the second liquid immersion space may be formed with the first liquid LQ to clean at least one of the final optical element 11 and the nozzle member 8. For example, when the first liquid LQ to be used has the cleaning ability (for example, fluorine-based liquid), or when the caused contamination can be satisfactorily removed (can be cleaned) with the first liquid LQ, then the cleaning can be performed satisfactorily with the first liquid LQ.

In the first to fourth embodiments described above, the first liquid LQ and the second liquid LC different from the first liquid LQ may be used in a chronological order in order to form the second liquid immersion space LS2 between the nozzle member 8 and the substrate table 22 (or the measuring table 32). For example, when the first liquid LQ is water (pure or purified water), and the second liquid LC is dissolved gas conditioned water (hydrogen water, nitrogen water or the like) obtained by dissolving a predetermined gas in water, then it is possible to execute the cleaning operation using the first liquid LQ, after the cleaning operation using the second liquid LC. It is possible to shorten the period of time required for the process for substituting the second liquid LC with the first liquid LQ after the completion of the cleaning operation.

The vibration member 150(C) and the ultrasonic wave generator 10(C) used in the embodiments described above are merely exemplary, for which it is possible to use those having various structures. For example, instead of the use of the vibration member 150(C), a liquid-repellent coating may be applied to the surface of the piezoelectric element of the ultrasonic wave generator 10(C), and the piezoelectric element may be provided so that the surface of the piezoelectric element, which is subjected to the coating, is flush with the upper surface 24 of the substrate table 22 or the upper surface 34 of the measuring table 32. In this case, the liquid-repellent coating film is the "vibration member" or the "certain member" of the present invention.

In the respective embodiments described above, the nozzle member 8 may be vibrated to apply the ultrasonic wave (vibration) to the liquid in the second liquid immersion space LS2.

In the respective embodiments described above, in order to facilitate the cleaning of the final optical element 11 and the nozzle member 8, the vibration (ultrasonic wave) of not less than 20 kHz is applied to the liquid (LQ or LC). However, it is also allowable to apply the vibration of less than 20 kHz to the liquid (LQ or LC). Alternatively, the frequency may be appropriately modulated as described above so that the frequency f1 of not less than 20 kHz and the frequency f2 of less than 20 kHz are periodically switched, or the frequencies f1, f2 are continuously changed therebetween.

Figure 14:
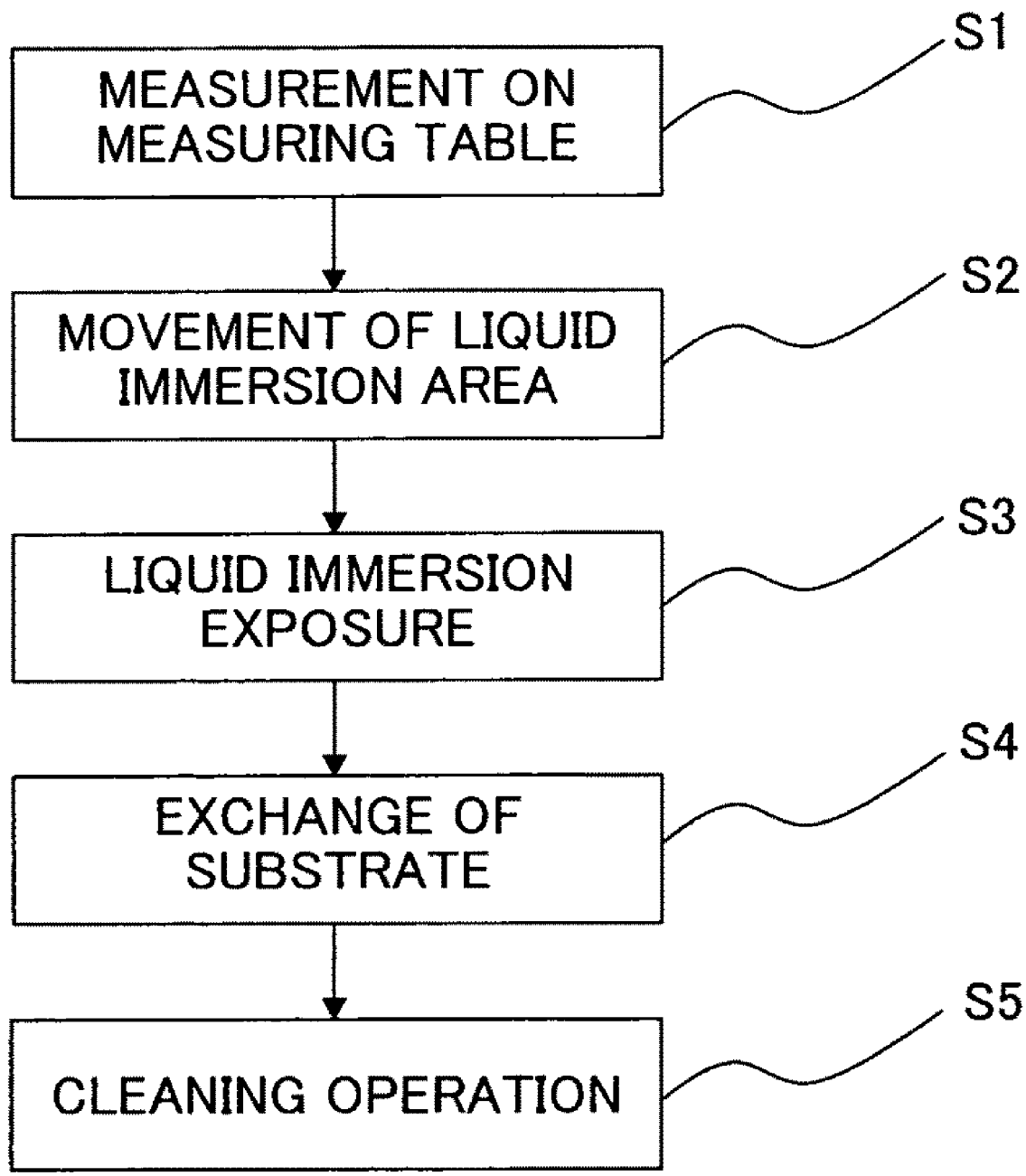
FIG. 14 is a flow chart illustrating an exemplary liquid immersion exposure sequence including the cleaning operation.

In the first to fourth embodiments described above, the cleaning operation for the final optical element 11 and the nozzle member 8 can be executed, for example, every time when a predetermined number or pieces of the substrate P are exposed, for every lot, or at every predetermined time interval. FIG. 14 shows an example of the sequence of the liquid immersion exposure including the cleaning operation as described in the first to fourth embodiments. The measuring table 32 is positioned at the position opposite to the nozzle member 8 in accordance with the control of the controller 7, the first liquid immersion space LS1 is formed between the nozzle member 8 and the measuring table 32, and the measurement is executed with the various measuring devices of the measuring table 32 via the first liquid LQ (S1). Subsequently, the substrate table 22 is moved to a position under or below the nozzle member 8 while separating the measuring table 32 away from the position under or below the nozzle member 8. Accordingly, the liquid LQ is delivered from the measuring table 32 to the substrate table 22, and the first liquid immersion space LS1 is formed between the substrate P on the substrate table 22 and the nozzle member 8 and the projection optical system PL (S2). The controller 7 adjusts the exposure condition of the substrate P based on the measurement result obtained on the measuring table 32 and performs the liquid immersion exposure for the substrate P (S3). When the liquid immersion exposure is completed, then the substrate table 22 is moved to the predetermined substrate exchange position, and the substrate is exchanged at that position (S4). The cleaning operation is executed as described above after the exchange of the substrate or concurrently with the exchange of the substrate (S5). For example, when the cleaning operation is performed on the substrate table 22 as in the first embodiment, the cleaning operation can be performed after the substrate exchange step S4 after the exposure is completed for a predetermined number or pieces of the substrate. When the cleaning operation is performed on the measuring table 32 as in the third embodiment, the cleaning operation can be performed concurrently with the substrate exchange step S4 on the substrate stage 22, or before or after the substrate exchange step S4 after the exposure is completed for a predetermined number or pieces of the substrate.

In the embodiments described above, a detector, which is capable of detecting the contamination state of at least one of the final optical element 11 and the nozzle member 8, may be provided; and the cleaning operation may be executed when it is judged that at least one of the final optical element 11 and the nozzle member 8 is contaminated, based on a detection result obtained by the detector. For example, a light amount detector may be arranged at the measuring table 32; and the light amount of the exposure light EL radiated from the lower surface 11A of the final optical element 11 may be detected by the light amount detector arranged at the measuring table 32. It is possible to judge whether or not the cleaning operation is to be executed, based on the detection result. There is a high possibility that the light amount of the exposure light EL radiated onto the light amount detector might change between a state that the lower surface 11A of the final optical element 11 is contaminated or dirtied and a state that the lower surface 11A of the final optical element 11 is not contaminated or dirtied. Therefore, it is possible to determine the contamination state of the lower surface 11A of the final optical element 11 based on the detection result of the light amount detector.

On the other hand, it is allowable to expose the substrate P with the exposure light EL via the mask M and the projection optical system PL and to perform the developing process, and then to measure the shape of the pattern formed on the substrate P by a predetermined measuring device; and to judge whether or not the cleaning operation is to be executed, based on the obtained measurement result. For example, if it is judged that the defect of the pattern is not within an allowable range based on the measurement result of the shape of the pattern, then it is judged that the contamination state of the lower surface 11A of the final optical element 11 is not within an allowable range as well, and to execute the cleaning operation.

Alternatively, the following is also allowable to provide an image pickup device (camera), capable of obtaining the image (optical image) information of the lower surface 11A of the final optical element 11, the lower surface 8A of the nozzle member 8, etc.; to judge whether or not the lower surface 11A of the final optical element 11, the lower surface 8A of the nozzle member 8, etc. is (are) contaminated based on the obtained image pickup result of the image pickup device; and to judge whether or not the cleaning operation is to be executed based on the result of the judgment.

In the embodiments described above, it is also allowable to provide a detector which detects the ultrasonic wave generated by the ultrasonic wave generator 10(C) via the vibration member 150(C). For example, an ultrasonic wave-receiving element constructed of PZT may be provided by embedding the ultrasonic wave-receiving element in the nozzle member 8 and/or the measuring table 32. With this, it is possible to confirm the ultrasonic wave is effectively transmitted to the second liquid immersion space LS2, and to observe the influence exerted on the transmission of the ultrasonic wave by the frequency of the ultrasonic wave and the supply and recovery of the second liquid LC (the flow rate, the medium, the temperature and the like). The piezoelectric element driving circuit of the ultrasonic wave generator 10(C) can be set most appropriately based on the obtained result of the observation.

In the respective embodiments described above, the upper surface 151 (151C) of the vibration member 150 (150C), the upper surface 24 of the substrate table 22, the upper surface 34 of the measuring table 32, etc. are liquid-repellent with respect to both of the first liquid LQ and the second liquid LC. However, these components may be liquid-repellent with respect only to one of the first liquid LQ and the second liquid LC, for example, with respect only to the first liquid LQ for the exposure.

It goes without saying that the cleaning operations and the cleaning mechanisms, explained in the respective embodiments (and in the various modifications thereof), can be appropriately combined and used. In the embodiments described above, the portions making contact with the liquid LQ, including the lower surface 11A of the final optical element 11, the lower surface 8A of the nozzle member 8 and the like, are cleaned by using the ultrasonic wave generated from the ultrasonic wave generator 10 when the cleaning liquid LC exists on the vibration member 150(C). However, these portions can be also cleaned by allowing the cleaning liquid LC to exist not only on the vibration member 150(C) but also on any portion (position) different from the vibration member 150(C) on the substrate table 22 and/or the measuring table 32. In this case, the substrate table 22 or the measuring table 32 may be moved with respect to the nozzle member 8 when the cleaning liquid LC exists between the lower surface 8A of the nozzle member 8 and the substrate table 22 or the measuring table 32.

The liquid LQ for the exposure is water in the respective embodiments described above. However, the liquid LQ may be any liquid other than water. For example, when the light source of the exposure light EL is the $F_2$ laser, the $F_2$ laser beam is not transmitted through water. Therefore, those preferably usable as the liquid LQ may include, for example, fluorine-based fluids such as fluorine-based oil and perfluoropolyether (PFPE) through which the $F_2$ laser beam is transmissive. Alternatively, other than the above, it is also possible to use, as the liquid LQ, those (for example, cedar oil) which have the transmittance with respect to the exposure light EL, which have the refractive index as high as possible, and which are stable against the photoresist coated on the surface of the substrate P and the projection optical system PL. As for the liquid LQ, it is also allowable to use those having the refractive index of about 1.6 to 1.8. The liquid LQ, which has the refractive index (for example, not less than 1.5) higher than that of pure water, includes, for example, predetermined liquids having the C—H bond or the O—H bond such as isopropanol having a refractive index of about 1.50 and glycerol (glycerin) having a refractive index of about 1.61; predetermined liquids (organic solvents) such as hexane, heptane, and decane, and decalin (decahydronaphthalene) having a refractive index of about 1.60. As for the liquid LQ, it is also allowable to use those obtained by mixing arbitrary two or more liquids of the foregoing liquids and those obtained by adding (mixing) at least one of the foregoing liquid or liquids to (with) pure water. Further, as for the liquid LQ, it is also allowable to use those obtained by adding (mixing) base or acid such as $H^+$, $Cs^+$, $K^+$, $Cl^-$, $SO_4^{2-}$, and $PO_4^{2-}$ to (with) pure water, and it is also allowable to use those obtained by adding (mixing) fine particles of Al oxide or the like to (with) pure water. As for the liquid LQ, it is preferable to use those which have the small coefficient of light absorption, which have the small temperature dependency, and which are stable against the photosensitive material coated on the surface of the substrate P (or the top coat film, the antireflection film, etc.) and/or the projection system PL. Further, those usable for the optical element (for example, the final optical element 11) of the projection optical system PL include those formed of single crystal materials of fluorine compounds such as barium fluoride, strontium fluoride, lithium fluoride, sodium fluoride, etc., other than silica glass and calcium fluoride. Alternatively, the optical element (the final optical element 11, etc.) of the projection optical system PL, which makes contact with the liquid LQ, may be formed of any material having a refractive index (for example, not less than 1.6) higher than those of silica glass and calcium fluoride. Those usable as the material having the refractive index of not less than 1.6 include sapphire, germanium dioxide and the like as disclosed, for example, in International Publication No. 2005/059617, and potassium chloride (refractive index: about 1.75) as disclosed in International Publication No. 2005/059618. As for the liquid LQ, it is also possible to use various fluids including, for example, supercritical fluids.

In the respective embodiments described above, the optical path on the light-exit side (image plane side) of the final optical element of the projection optical system is filled with the liquid. However, it is also possible to adopt a projection optical system wherein the optical path space on the light-incident side (object plane side) of the final optical element is also filled with the liquid, as disclosed in International Publication No. 2004/019128 (corresponding to United States Patent Application Publication No. 2005/0248856).

The respective embodiments described above adopt the exposure apparatus in which the space between the projection optical system PL and the substrate P is locally filled with the liquid. However, it is also possible to adopt a liquid immersion exposure apparatus which performs the exposure in a state that the entire surface of the substrate as the exposure objective is immersed in the liquid as disclosed, for example, in U.S. Pat. No. 5,825,043.

The substrate P, which is usable in the respective embodiments described above, is not limited only to the semiconductor wafer for producing the semiconductor device. Those applicable include a glass substrate for a display device, a ceramic wafer for a thin film magnetic head, a master plate (synthetic silica glass, silicon wafer) for a mask or reticle used for the exposure apparatus, and the like.

As for the exposure apparatus EX, in addition to the scanning type exposure apparatus (scanning stepper) of the step-and-scan system for performing the scanning exposure with the pattern of the mask M by synchronously moving the mask M and the substrate P, it is possible to adopt a projection exposure apparatus (stepper) of the step-and-repeat system for performing the full field exposure with the pattern of the mask M in a state that the mask M and the substrate P are allowed to stand still, and then by successively step-moving the substrate P.

It is also allowable to adopt, as the exposure apparatus EX, a full field exposure apparatus of the stitch system wherein a reduction image of a first pattern is transferred onto the substrate P by using a projection optical system in a state that the first pattern and the substrate P are allowed to substantially stand still during the exposure in the step-and-repeat manner, and then the full field exposure is performed on the substrate P by partially overlaying a reduction image of a second pattern with respect to the first pattern by using the projection optical system in a state that the second pattern and the substrate P are allowed to substantially stand still. As for the exposure apparatus of the stitch system, it is also possible to adopt an exposure apparatus of the step-and-stitch system wherein at least two patterns are partially overlaid and transferred onto the substrate P, and the substrate P is successively moved.

It is also possible to adopt, as the exposure apparatus EX, for example, an exposure apparatus in which patterns of two masks are combined on the substrate via the projection optical system, and one shot area on the substrate is subjected to the double exposure substantially simultaneously by one time of the scanning exposure as disclosed, for example, in U.S. Pat. No. 6,611,316. It is also possible to adopt, as the exposure apparatus EX, an exposure apparatus of the proximity system, a mirror projection aligner, etc.

It is also possible to adopt, as the exposure apparatus EX, a twin-stage type exposure apparatus provided with a plurality of substrate stages as disclosed in U.S. Pat. Nos. 6,341,007, 6,400,441, 6,549,269, 6,590,634, 6,208,407, 6,262,796 and the like. It is also possible to adopt the exposure apparatus provided with a plurality of substrate stages and measuring stages. In the case of the exposure apparatus provided with a plurality of stages, it is also allowable that the vibration member and the vibration generator are provided on any one of the stages. In the embodiments described above, the vibration member 150(C) and the ultrasonic wave generator 10(C) are provided on the substrate table and/or the measuring table. However, it is also allowable to provide another movable table different from the tables, for example, a table which is used exclusively for the cleaning and is provided with the vibration member and the ultrasonic wave generator.

As for the type of the exposure apparatus EX, the present invention is not limited to the exposure apparatus for the semiconductor device production for exposing the substrate P with the semiconductor device pattern. The present invention is also widely applicable to an exposure apparatus for producing a liquid crystal display device or for producing a display as well as an exposure apparatus for producing, for example, a thin film magnetic head, an image pickup device (CCD), a micromachine, MEMS, a DNA chip, the reticle, or the mask, etc.

In the respective embodiments described above, the interferometer system, which includes the laser interferometer, is used to measure the position information about each of the mask stage, the substrate stage and the measuring stage. However, the measurement of the position information is not limited to this. For example, it is also allowable to use an encoder system for detecting a scale (diffraction grating) provided on each of the stages. In this case, it is preferable that a hybrid system including both of the interferometer system and the encoder system is provided, and the measurement result of the encoder system is calibrated (subjected to the calibration) by using the measurement result of the interferometer system. The position control of the stage may be performed by switchingly using the interferometer system and the encoder system or using both of the interferometer system and the encoder system.

In the respective embodiments described above, the ArF excimer laser may used as the light source device for generating the ArF excimer laser light beam as the exposure light EL. However, it is also allowable to use a high harmonic wave-generating device which includes a solid laser light source such as a DFB semiconductor laser or a fiber laser, etc.; a light-amplifying section having a fiber amplifier or the like; and a wavelength-converting section and which outputs a pulse light beam having a wavelength of 193 nm as disclosed, for example, in U.S. Pat. No. 7,023,610. Further, in the embodiments described above, each of the illumination areas and the projection areas described above is rectangular. However, it is also allowable to adopt any other shape including, for example, circular arc-shaped forms.

In the embodiments described above, the light-transmissive type mask is used, in which the predetermined light-shielding pattern (or phase pattern or dimming or light-reducing pattern) is formed on the light-transmissive substrate. However, instead of such a mask, as disclosed, for example, in U.S. Pat. No. 6,778,257, it is also allowable to use a variable shaped mask (also referred to as "electronic mask", "active mask", or "image generator") on which a transmissive pattern, a reflective pattern, or a light-emitting pattern is formed based on the electronic data of a pattern to be subjected to the exposure. The variable shaped mask includes, for example, DMD (Digital Micro-mirror Device) as a kind of the non-light emission type image display device (spatial light modulator). The variable shaped mask is not limited to DMD. Instead of DMD, it is also allowable to use a non-light emission type image display device as explained below. The non-light emission type image display device is a device or element which spatially modulates the state of the polarization, the phase, or the amplitude (intensity) of the light traveling in a predetermined direction. The transmission type spatial light modulator includes, for example, an electrochromic display (ECD) other than the transmission type liquid crystal display device (LCD: Liquid Crystal Display). In addition to DMD described above, the reflection type spatial light modulator can be exemplified by a reflecting mirror array, a reflection type liquid crystal display device, an electrophoresis display (EPD: Electro Phonetic Display), an electronic paper (or the electronic ink), an optical diffraction type light valve (Grating Light Valve), etc.

It is also allowable to provide a pattern-forming device including a self-light emission type image display device, instead of the variable shaped mask provided with the non-light emission type image display device. In this case, it is unnecessary to provide the illumination optical system. The self-light emission type image display device includes, for example, CRT (Cathode Ray Tube), an inorganic EL display, an organic EL display (OLED: Organic Light Emitting Diode), an LED display, an LD display, an electric field emission display (FED: Field Emission Display), a plasma display (PDP: Plasma Display Panel) and the like. For example, a solid light source chip having a plurality of light emission points, a solid light source chip array including a plurality of chips arranged in an array form, a device of a type including a plurality of light emission points prepared on one substrate, etc. may be used as the self-light emission type image display device provided for the pattern-forming device. Such a solid light source chip may be electrically controlled to form a pattern. The solid light source device or element may be inorganic or organic.

The respective embodiments described above are illustrative of the exemplary case of the exposure apparatus provided with the projection optical system PL. However, the present invention may be adopted for an exposure apparatus and an exposure method which use no projection optical system PL. Even when the projection optical system PL is not used, the exposure light is radiated onto the substrate via an optical member such as a lens, and the liquid immersion space is formed in a predetermined space between such an optical member and the substrate.

It is possible to adopt, as the exposure apparatus EX, an exposure apparatus (lithography system) in which the substrate P is exposed with a line-and-space pattern by forming interference fringes on the substrate P as disclosed, for example, in International Publication No. 2001/035168. The present invention is also applicable to a liquid immersion type exposure apparatus wherein the liquid immersion area between the projection optical system and the substrate is retained by an air curtain formed thereabout.

The exposure apparatus EX according to the embodiment of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness, etc. are managed.

Figure 15:
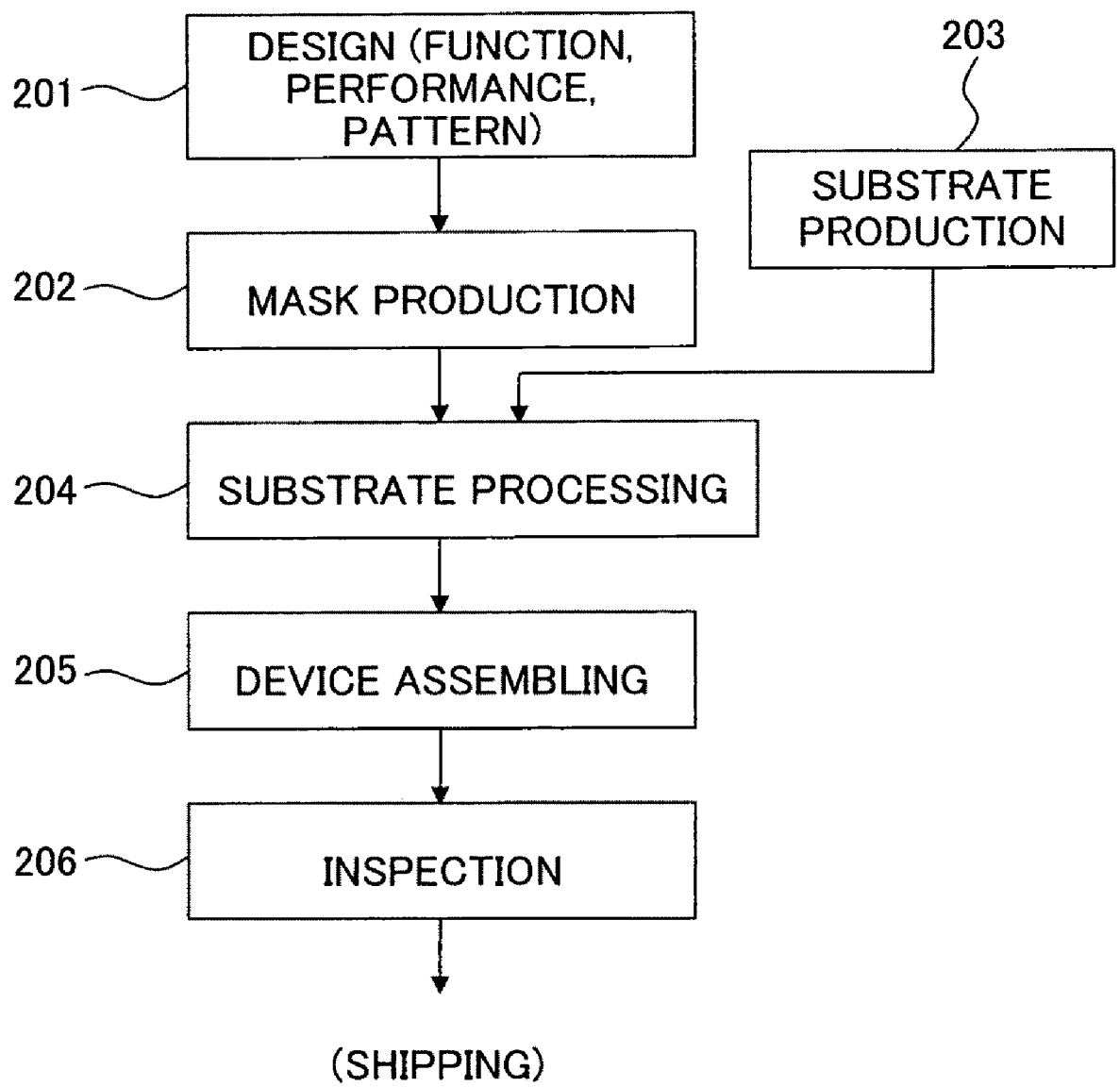
FIG. 15 is a flow chart illustrating exemplary steps of producing a microdevice.

As shown in FIG. 15, a microdevice such as a semiconductor device is produced by performing, for example, a step 201 of designing the function and the performance of the microdevice; a step 202 of manufacturing a mask (reticle) based on the designing step; a step 203 of producing a substrate as a base material for the device; a substrate-processing step 204 including the process of exposing the substrate with the exposure light from the mask in accordance with the embodiment described above and developing the exposed substrate; a step 205 of assembling the device (including processing processes such as a dicing step, a bonding step, a packaging step, etc.); an inspection step 206; and the like. The cleaning method performed in the exposure apparatus EX as explained in the foregoing respective embodiments is included in the substrate-processing step 204. The substrate P is exposed by using the exposure apparatus EX cleaned by the cleaning method.

The embodiments of the present invention have been explained above. However, in the present invention, it is possible to appropriately combine and use all of the constitutive components described above. In some cases, a part or parts of the constitutive components are not used. For example, in the fourth embodiment and the modifications thereof, it is also allowable that the surface of the vibration member is not liquid-repellent with respect to the liquid immersion liquid LQ and/or the cleaning liquid LC. In the respective embodiments described above, it is not necessarily indispensable that the first and second liquid supply devices 86, 96 and the liquid recovery device 89 are not provided for the exposure apparatus; for example, it is also allowable to substitutively use the equipment of the factory or the like in which the exposure apparatus is installed. The structure, which is required for the liquid immersion exposure, is not limited to the structure as described above. It is possible to use those disclosed, for example, in European Patent Publication No. 1420298, International Publication Nos. 2004/055803, 2004/057590, 2005/029559 (corresponding to United States Patent Publication No. 2006/0231206), and International Publication No. 2004/086468 (corresponding to United States Patent Publication No. 2005/0280791), and Japanese Patent Application Laid-open No. 2004-289126 (corresponding to U.S. Pat. No. 6,952,253). In relation to the liquid immersion mechanism of the liquid immersion exposure apparatus and the apparatuses equipped thereto, the contents of U.S. Pat. No. 6,952,253 and United States Patent Publication Nos. 2006/0231206 and 2005/0280791, etc. as described above are incorporated herein by reference within a range of permission of the domestic laws and ordinances of the designated state or the selected state.

The contents of all of the published patent documents and United States Patents in relation to the exposure apparatus, etc., which are cited in the respective embodiments and the modifications described above, are incorporated herein by reference.

According to the exposure method and the device production method of the present invention, a portion or portions of the exposure apparatus making contact with the liquid is (are) effectively cleaned by using the cleaning liquid, and hence the yield of the produced device is improved. Therefore, the present invention will remarkably contribute to the international development of the precision mechanical equipment industry including the semiconductor industry.

What is claimed is:

1. An exposure apparatus which exposes a substrate with an exposure light through an exposure liquid, the exposure apparatus comprising:
   an optical element from which the exposure light exits;
   a movable member which is movable on a light-exit side of the optical element;
   a certain member which is provided on the movable member, a gap being formed between the movable member and the certain member; and
   a vibration generator which vibrates the certain member to apply vibration to a cleaning liquid on the certain member,
   wherein at least a part of a surface of the certain member is liquid-repellent with respect to at least one of the exposure liquid and the cleaning liquid, and the surface of the certain member is capable of making contact with the at least one of the exposure liquid and the cleaning liquid; and
   the movable member has a recovery port which recovers the at least one of the exposure liquid and the cleaning liquid in the gap.

2. The exposure apparatus according to claim 1, wherein the vibration generator is connected to the certain member.

3. The exposure apparatus according to claim 1, wherein the vibration generator includes a piezoelectric element.

4. The exposure apparatus according to claim 1, wherein the vibration generator applies an ultrasonic wave to the cleaning liquid.

5. The exposure apparatus according to claim 1, wherein the cleaning liquid includes cleaning water in which a predetermined gas is dissolved in water.

6. The exposure apparatus according to claim 1, wherein the cleaning liquid includes the exposure liquid.

7. The exposure apparatus according to claim 1, further comprising a liquid immersion member which is arranged in the vicinity of the optical element,
   wherein the vibration generator applies the vibration to the cleaning liquid between the certain member and the liquid immersion member to clean the liquid immersion member.

8. The exposure apparatus according to claim 7, wherein the liquid immersion member has a supply port through which the cleaning liquid is supplied.

9. The exposure apparatus according to claim 7, wherein the liquid immersion member has a recovery port through which the cleaning liquid is recovered.

10. The exposure apparatus according to claim 7, further comprising a supply port through which the cleaning liquid is supplied,
    wherein the supply port is provided on the movable member.

11. The exposure apparatus according to claim 7, wherein the certain member has a first surface which is opposable to a lower surface of the liquid immersion member;
    the movable member has a second surface which is opposable to the lower surface of the liquid immersion member; and
    the first surface and the second surface are arranged with the gap intervening therebetween.

12. The exposure apparatus according to claim 11, wherein the second surface is arranged around the first surface.

13. The exposure apparatus according to claim 11, wherein the first surface and the second surface are arranged in a same plane.

14. The exposure apparatus according to claim 13, wherein the substrate is held by the movable member; and the first surface and the second surface are flush with a surface of the substrate held by the movable member.

15. The exposure apparatus according to claim 13, wherein the movable member is provided with a measuring device and does not hold the substrate; and
the first surface and the second surface are flush with a surface of the measuring device.

16. The exposure apparatus according to claim 7, wherein a surface of the certain member, which makes contact with the cleaning liquid, has a size which is smaller than a liquid immersion space formed between the liquid immersion member and the movable member.

17. The exposure apparatus according to claim 1, wherein the vibration generator applies the vibration to the cleaning liquid between the certain member and the optical element to clean the optical element.

18. The exposure apparatus according to claim 1, further comprising a suppressing device which suppresses diffusion of heat generated by the vibration generator.

19. The exposure apparatus according to claim 1, further comprising a temperature adjusting device which adjusts a temperature of the vibration generator.

20. The exposure apparatus according to claim 1, wherein the certain member is arranged on the movable member via the vibration generator such that no contact is made between the certain member and the movable member.

21. The exposure apparatus according to claim 1, wherein the vibration generator is provided on the movable member via an anti-vibration member.

22. A method for producing a device, comprising:
exposing a substrate by using the exposure apparatus as defined in claim 1; and
developing the exposed substrate.

23. The exposure apparatus according to claim 1, wherein the certain member is capable of making contact directly with the cleaning liquid.

24. An exposure apparatus which exposes a substrate with an exposure light through an exposure liquid, the exposure apparatus comprising:
an optical element from which the exposure light exits;
a movable member which is movable on a light-exit side of the optical element;
a certain member which is provided on the movable member, a gap being formed between the movable member and the certain member;
a vibration generator which vibrates the certain member to apply vibration to a cleaning liquid on the certain member; and
a suppressing device which suppresses diffusion of heat generated by the vibration generator,
wherein the certain member is capable of making contact with at least one of the exposure liquid and the cleaning liquid; and
the movable member has a recovery port which recovers the at least one of the exposure liquid and the cleaning liquid in the gap.

25. The exposure apparatus according to claim 24, wherein the suppressing device includes a fluid supply device which supplies a fluid for temperature adjustment.

26. The exposure apparatus according to claim 25, wherein the suppressing device includes a first member arranged surrounding at least at a part of the vibration generator, and uses the fluid supplied from the fluid supply device to adjust a temperature of the first member.

27. The exposure apparatus according to claim 26, wherein the first member has an internal flow passage; and
the fluid flows through the internal flow passage.

28. The exposure apparatus according to claim 26, wherein the suppressing device includes a second member which is arranged surrounding at least at a part of the certain member.

29. The exposure apparatus according to claim 24, wherein the suppressing device includes a first member which is arranged surrounding at least at a part of the vibration generator.

30. The exposure apparatus according to claim 24, wherein the vibration generator includes a piezoelectric element.

31. The exposure apparatus according to claim 24, wherein the vibration generator applies an ultrasonic wave to the cleaning liquid.

32. The exposure apparatus according to claim 24, further comprising a liquid immersion member which is arranged in the vicinity of the optical element,
wherein the vibration generator applies the vibration to the cleaning liquid between the certain member and the liquid immersion member to clean the liquid immersion member.

33. The exposure apparatus according to claim 32, wherein surface of the certain member, which makes contact with the cleaning liquid, has a size which is smaller than a liquid immersion space formed between the liquid immersion member and the movable member.

34. The exposure apparatus according to claim 24, wherein the vibration generator applies the vibration to the cleaning liquid between the certain member and the optical element to clean the optical element.

35. The exposure apparatus according to claim 24, wherein the movable member holds the substrate.

36. The exposure apparatus according to claim 24, wherein the movable member is provided with a measuring device, and does not hold the substrate.

37. The exposure apparatus according to claim 24, wherein the certain member is arranged on the movable member via the vibration generator such that no contact is made between the certain member and the movable member.

38. The exposure apparatus according to claim 24, wherein the vibration generator is provided on the movable member via an anti-vibration member.

39. A method for producing a device, comprising:
exposing a substrate by using the exposure apparatus as defined in claim 24; and
developing the exposed substrate.

40. The exposure apparatus according to claim 24, wherein the certain member is capable of making contact directly with the cleaning liquid.

41. A cleaning apparatus usable for a liquid immersion exposure apparatus which exposes a substrate with an exposure light through an exposure liquid, the cleaning apparatus comprising:
a certain member which is provided on a movable member, a gap being formed between the movable member and the certain member; and
a vibration generator which vibrates the certain member to apply vibration to a cleaning liquid making contact with the certain member,
wherein at least a part of a surface of the certain member is liquid-repellent with respect to at least one of the exposure liquid and the cleaning liquid, and the surface of the certain member is capable of making contact with the at least one of the exposure liquid and the cleaning liquid; and
the movable member has a recovery port which recovers the at least one of the exposure liquid and the cleaning liquid in the gap.

42. The cleaning apparatus according to claim 41, wherein the vibration generator is connected to the certain member.

43. The cleaning apparatus according to claim 41, wherein the vibration generator includes a piezoelectric element.

44. The cleaning apparatus according to claim 41, further comprising a suppressing device which suppresses diffusion of heat generated by the vibration generator.

45. The cleaning apparatus according to claim 41, further comprising a temperature adjusting device which adjusts a temperature of the vibration generator.

46. The cleaning apparatus according to claim 41, wherein the cleaning liquid includes cleaning water in which a predetermined gas is dissolved in water.

47. The cleaning apparatus according to claim 41, wherein the cleaning liquid includes the exposure liquid.

48. The cleaning apparatus according to claim 41, wherein the vibration generator applies ultrasonic vibration to the cleaning liquid.

49. The cleaning apparatus according to claim 41, wherein the certain member is capable of making contact directly with the cleaning liquid.

50. A cleaning apparatus usable for a liquid immersion exposure apparatus which exposes a substrate with an exposure light through an exposure liquid, the cleaning apparatus comprising:
 a certain member which is provided on a movable member, a gap being formed between the movable member and the certain member;
 a vibration generator which vibrates the certain member to apply vibration to a cleaning liquid making contact with the certain member; and
 a suppressing device which suppresses diffusion of heat generated by the vibration generator,
 wherein the certain member is capable of making contact with the at least one of the exposure liquid and the cleaning liquid; and
 the movable member has a recovery port which recovers the at least one of the exposure liquid and the cleaning liquid in the gap.

51. The cleaning apparatus according to claim 50, wherein the suppressing device includes a fluid supply device which supplies a fluid for temperature adjustment.

52. The cleaning apparatus according to claim 51, wherein the suppressing device includes a first member arranged surrounding at least at a part of the vibration generator, and uses the fluid supplied from the fluid supply device to adjust a temperature of the first member.

53. The cleaning apparatus according to claim 52, wherein the first member has an internal flow passage; and
 the fluid flows through the internal flow passage.

54. The cleaning apparatus according to claim 52, wherein the suppressing device includes a second member which is arranged surrounding at least at a part of the certain member.

55. The cleaning apparatus according to claim 50, wherein the vibration generator includes a piezoelectric element.

56. The cleaning apparatus according to claim 50, wherein the cleaning liquid includes cleaning water in which a predetermined gas is dissolved in water.

57. The cleaning apparatus according to claim 50, wherein the cleaning liquid includes the exposure liquid.

58. The cleaning apparatus according to claim 50, wherein the vibration generator applies an ultrasonic wave to the cleaning liquid.

59. The cleaning apparatus according to claim 50, further comprising an anti-vibration member which prevents vibration, generated from the vibration generator, from being transmitted to the exposure apparatus.

60. A cleaning method for using, in a liquid immersion exposure apparatus, the cleaning apparatus as defined in claim 50, the cleaning method comprising:
 forming a liquid immersion space with a cleaning liquid on the certain member of the cleaning apparatus; and
 applying ultrasonic vibration to the cleaning liquid in the liquid immersion space.

61. The cleaning method according to claim 60, wherein a portion, of the liquid immersion exposure apparatus, which makes contact with an exposure liquid is cleaned with the cleaning liquid.

62. The cleaning method according to claim 61, wherein the portion, which makes contact with the exposure liquid, is a part of an optical element provided for the exposure apparatus or a part of a liquid supply member supplying the exposure liquid.

63. The cleaning apparatus according to claim 50, wherein the certain member is capable of making contact directly with the cleaning liquid.

64. A liquid immersion exposure method for exposing a substrate with an exposure light through an exposure liquid by using an exposure apparatus having first and second tables, the liquid immersion exposure method comprising:
 performing measurement for determining an exposure condition, via the exposure liquid placed between an optical element and a measuring device which is provided on the first table;
 exposing the substrate with the exposure light through the exposure liquid between the substrate and the optical element;
 placing a cleaning liquid between the optical element and a vibrator provided on the first or second table; and
 vibrating the vibrator to clean a portion, of the exposure apparatus, which makes contact with the exposure liquid,
 wherein a gap is formed between the vibrator and the first or second table; and
 a liquid in the gap is recovered by a recovery port formed on the first or second table, the liquid including at least one of the exposure liquid and the cleaning liquid.

65. The liquid immersion exposure method according to claim 64, wherein the cleaning liquid is placed between the optical element and the vibrator provided on the first table and the vibrator is vibrated to clean the portion of the exposure apparatus which makes contact with the exposure liquid.

66. The liquid immersion exposure method according to claim 65, wherein the portion of the exposure apparatus which makes contact with the exposure liquid is cleaned during a period in which the substrate is exchanged on the second table.

67. The liquid immersion exposure method according to claim 64, wherein a surface which makes contact with the cleaning liquid is liquid-repellent.

68. The liquid immersion exposure method according to claim 64, wherein a vibration member, which makes contact with the cleaning liquid, is connected to the vibrator.

69. The liquid immersion exposure method according to claim 64, wherein the vibrator is capable of making contact directly with the cleaning liquid.

* * * * *